(12) United States Patent
Evans et al.

(10) Patent No.: US 12,740,376 B2
(45) Date of Patent: Sep. 15, 2026

(54) LIFT PIN ACTUATORS FOR SEMICONDUCTOR PROCESSING SYSTEMS AND RELATED METHODS

(71) Applicant: ASM IP Holding, B.V., Almere (NL)

(72) Inventors: Bradley Wayne Evans, Apache Junction, AZ (US); Shujin Huang, Phoenix, AZ (US); Junwei Su, Tempe, AZ (US); Loc Tran, Gilbert, AZ (US); Xing Lin, Chandler, AZ (US); Alexandros Demos, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 363 days.

(21) Appl. No.: 18/476,067

(22) Filed: Sep. 27, 2023

(65) Prior Publication Data

US 2024/0112946 A1 Apr. 4, 2024

Related U.S. Application Data

(60) Provisional application No. 63/377,772, filed on Sep. 30, 2022.

(51) Int. Cl.
*H10P 72/76* (2026.01)
*C23C 16/458* (2006.01)

(52) U.S. Cl.
CPC ...... *H10P 72/7612* (2026.01); *C23C 16/4585* (2013.01)

(58) Field of Classification Search
CPC ............ H10P 72/7612; H10P 72/0432; H10P 72/7602; H10P 14/24; H10P 14/3411; H10P 72/7626; H10P 72/7624; C23C 16/4585; C23C 16/4583; C23C 16/455; C23C 16/4412; C23C 16/18; C23C 16/4481; C30B 25/16; B05D 1/60; H01L 45/1616
USPC ............... 118/715, 728; 156/345.33, 345.34; 269/1; 279/1; 427/248.1
See application file for complete search history.

(56) References Cited

U.S. PATENT DOCUMENTS 6,190,113 B1 * 2/2001 Bui .................... H10P 72/7612 414/217
10,770,336 B2 * 9/2020 Hill .................... H10P 72/7612
11,018,047 B2 * 5/2021 Rokkam ............ H10P 72/7612
11,587,821 B2 * 2/2023 Hill .................... H10P 72/7612
12,040,217 B2 * 7/2024 Hill .................... H10P 72/7612
(Continued)

*Primary Examiner* — Rudy Zervigon
(74) *Attorney, Agent, or Firm* — Banner & Witcoff, Ltd.

(57) ABSTRACT

A lift pin actuator includes a castellated annulus, a first arm, a second arm, and a pin pad. The annulus arranged along a rotation axis and has a first merlon and a second merlon circumferentially separated by a crenel. The first arm is connected to the first merlon and extends outward from the annulus, the second arm is connected to the second merlon and extends outward from the annulus, and the second arm is circumferentially spaced from the first arm by a radial gap. The pin pad is connected to the annulus by the first arm and the second arm, is radially spaced from the annulus by the radial gap, and radially overlaps the crenel to nest a support member within the lift pin actuator during translation of the lift pin actuator along the rotation axis relative to the support member. Process kits, semiconductor processing systems, methods of making lift pin actuators and related material layer deposition methods are also described.

24 Claims, 15 Drawing Sheets

(56) References Cited

U.S. PATENT DOCUMENTS

| | | | | |
|---|---|---|---|---|
| 2018/0135172 | A1* | 5/2018 | Nogami | C23C 16/0218 |
| 2019/0051555 | A1* | 2/2019 | Hill | H10P 72/7612 |
| 2019/0229008 | A1* | 7/2019 | Rokkam | H10P 72/7612 |
| 2020/0365444 | A1* | 11/2020 | Hill | H10P 72/7612 |
| 2022/0106683 | A1 | 4/2022 | Baluja | |
| 2023/0163019 | A1* | 5/2023 | Hill | H10P 72/7612<br>216/58 |
| 2025/0038040 | A1* | 1/2025 | Moradian | H10P 72/7614 |
| 2025/0308979 | A1* | 10/2025 | Evans | H10P 72/7626 |
| 2025/0343066 | A1* | 11/2025 | Evans | H10P 72/7612 |

* cited by examiner

LIFT PIN ACTUATORS FOR SEMICONDUCTOR PROCESSING SYSTEMS AND RELATED METHODS

CROSS-REFERENCE TO RELATED APPLICATION(S)

This application claims the benefit of U.S. Provisional Application 63/377,772 filed on Sep. 30, 2022, the entire contents of which are incorporated herein by reference.

FIELD OF INVENTION

The present disclosure generally relates to depositing material layers onto substrates, and more particularly, to seating and unseating substrates from substrate supports using lift pins prior to and after deposition of material layers onto substrates.

BACKGROUND OF THE DISCLOSURE

Material layers are commonly deposited onto substrates during the fabrication of semiconductor devices, such as integrated circuits and power electronic device, using atomic layer deposition and chemical vapor deposition techniques. Material layer deposition is generally accomplished by support a substrate within a process chamber, heating the substrate to a desired deposition temperature, and exposing the substrate to a material layer precursor. As the material substrate is exposed to the material layer precursor a material layer deposits on the surface, typically at a rate and resultant thickness corresponding to temperature of the substrate during exposure to the material layer precursor.

In some material layer deposition techniques thickness of the material layer can vary due to temperature variation of the substrate while exposed to the material layer precursor. For example, structures located between the substrate and the heat source employed to heat the substrate may be heated by thermal energy communicated to the substrate. Once heated, the structure intermediate the heater and the substrate may locally prolong heating of a portion of the substrate in proximity to the structure, the material layer thickness locally varying according to the thermal characteristics of the structure intermediate the substrate and heater. Such structures intermediate the heater and the substrate may also complicate temperature control of the substrate during deposition of the material layer onto the substrate. For example, thermal energy banked by the structure intermediate the heater and the substrate may locally slow response to change in thermal energy output by the heater by tendency of the structure to radiate heat according to the thermal mass of the structure when output of the heater is reduced.

Various countermeasures exist temperature variation during material layer deposition. For example, zone control may be employed by the heater during deposition of the material layer onto the substrate. Zone control enables the heater to communicate different amounts of thermal energy to the substrate during material layer deposition, enabling the heater to compensate for the effect of structure intermediate the heater and the substrate during material layer deposition. Temperature measurements may be acquired from locations on the substrate at locations outside of the locality affected by the structure intermediate the heater and the substrate, limiting the tendency of the structure to introduce a lag into appreciation of substrate temperature change in temperature measurements acquired using the temperature sensor. And differential temperature sensing regimes may be employed to control substrate temperature during deposition of material layers onto substrates. Differential temperature sensing regimes enabling monitoring substrate temperate at both the locality affected by the structure intermediate the heater and the substrate as well as a regime unaffected by the structure intermediate the heater and the substrate, limiting the effect that the structure may have on differential heating of the substrate by the heater.

Such systems and methods having generally been acceptable for their intended purpose. However, there remains a need in the art for improved support members for chambers employed to deposit material layers onto substrates, process kits and semiconductor processing systems having such substrates, and related material layer deposition techniques and methods of making substrate supports. The present disclosure provides a solution to this need.

SUMMARY OF THE DISCLOSURE

A lift pin actuator includes a castellated annulus, a first arm, a second arm, and a pin pad. The annulus is arranged along a rotation axis and has a first merlon and a second merlon circumferentially spaced apart from one another by a crenel. The first arm is connected to the first merlon and extends outward from the annulus. The second arm is connected to the second merlon, extends outward from the annulus, and is spaced from the first arm by a radial gap. The pin pad is connected to the annulus by the first arm and the second arm, is spaced apart from the annulus by the radial gap, and radially overlaps the crenel to nest a support member within the lift pin actuator during translation of the lift pin actuator along the rotation axis relative to the support member.

In addition to one or more of the features described above, or as an alternative, further examples may include that the castellated annulus is formed from quartz, the first arm is formed from quartz, the second arm is formed from quartz, and that the pin pad is formed from quartz. The lift pin actuator may be formed as a weldment in certain examples.

In addition to one or more of the features described above, or as an alternative, further examples may include that the castellated annulus comprises three merlons circumferentially spaced apart from one another by three crenels.

In addition to one or more of the features described above, or as an alternative, further examples may include that the crenel is a first crenel, that the castellated annulus defines a second crenel and a third crenel, and that the annulus has a third merlon. The third merlon may be circumferentially spaced from the second merlon by the second crenel. The third merlon may be circumferentially spaced from the first merlon by the third crenel.

In addition to one or more of the features described above, or as an alternative, further examples may include that the first arm is tangent to the castellated annulus and arranged along a first arm axis, and that the second arm is also tangent to the castellated annulus and arranged along a second arm axis. The first arm axis may be skew to the rotation axis. The second arm may be skew to the rotation axis.

In addition to one or more of the features described above, or as an alternative, further examples may include that the first arm and the second arm form a first arm pair, and that the lift pin actuator further includes a second arm pair extending outward from the castellated annulus and circumferentially offset from the first arm pair about the rotation axis, a third arm pair extending radially outward from the castellated annulus and circumferentially intermediate the second arm pair and the third arm pair.

In addition to one or more of the features described above, or as an alternative, further examples may include a third arm is circumferentially offset from the first arm and extending outward from the castellated annulus, the second arm and the third arm extending outward from the second merlon; and a fourth arm circumferentially offset from the third arm and extending outward from the castellated annulus, the fourth arm is circumferentially spaced from the first arm by both the crenel and the second merlon.

In addition to one or more of the features described above, or as an alternative, further examples may include that the third arm is joined to the second arm by a butt weld overlying the second merlon, and that the third arm and the second arm define an obtuse angle radially outward of the castellated annulus.

In addition to one or more of the features described above, or as an alternative, further examples may include that the third arm and the second arm are defined by a continuous arm body, that the third arm separated from the second arm by an arcuate arm body segment, and that the arcuate arm segment joined to the second merlon by an arm body weld.

In addition to one or more of the features described above, or as an alternative, further examples may include that the second merlon has a flange portion extending radially outward from the castellated annulus, and that the third arm and the second arm are connected to the castellated annulus by an axial weld overlying the flange portion.

In addition to one or more of the features described above, or as an alternative, further examples may include that the castellated annulus has a third merlon and that the lift pin actuator further include a fifth arm and a sixth arm. The fifth arm may be circumferentially offset from the fourth arm and extend outward from the castellated annulus. The fifth arm may be connected to the third merlon. The sixth arm may be circumferentially intermediate the fifth arm and the first arm. The sixth arm may be connected to the third merlon.

In addition to one or more of the features described above, or as an alternative, further examples may include that the pin pad is axially offset from the castellated annulus by the first arm and the second arm of the lift pin actuator.

In addition to one or more of the features described above, or as an alternative, further examples may include that the pin pad is fixed to the first arm by a first arm weld, and that the pin pad is fixed to the second arm by a second arm weld.

In addition to one or more of the features described above, or as an alternative, further examples may include that the first arm weld connects a pin pad underside to the first arm, that the second arm weld connects the pin pad underside to the second arm.

In addition to one or more of the features described above, or as an alternative, further examples may include that the first arm and the second arm are connected to a radially inner edge of the pin pad at a first arm edge weld and a second arm edge weld. The second arm edge weld may be offset from the first arm edge weld about the rotation axis.

In addition to one or more of the features described above, or as an alternative, further examples may include that the pin pad is a first pin pad and the lift pin actuator further includes a second pin pad and a third pin pad. The second pin pad may be circumferentially offset from the first pin pad about the rotation axis. The third pin pad may be circumferentially intermediate the second pin pad and the first pin pad.

In addition to one or more of the features described above, or as an alternative, further examples may include that the first arm and the second arm form a first arm pair, and that the lift pin actuator further includes a second arm pair and a third arm pair. The second arm pair may be circumferentially offset from the first arm pair. The second arm pair may connect the second pin pad to the castellated annulus and define a second radial gap therebetween. The third arm pair may be circumferentially intermediate the second arm pair and the first arm pair. The third arm pair may connect the third pin pad to the castellated annulus and define radial gap therebetween. The second pin pad may be radially separated from a second crenel by the second radial gap. The third pin pad may be radially separated from a third crenel by the third radial gap.

In addition to one or more of the features described above, or as an alternative, further examples may include that the castellated annulus has a wall thickness, that the first arm and the second arm have an arm diameter, and that the arm diameter of the first arm and the second arm is greater than the wall thickness of the castellated annulus.

A semiconductor processing system includes a chamber body having a hollow interior and a divider with a divider aperture seated within the chamber body and dividing the interior of the chamber body into an upper chamber and a lower chamber, the divider aperture fluidly coupling the upper chamber to the lower chamber. A substrate support is arranged within the divider aperture and is configured to seat thereon a substrate during deposition of a material layer onto the substrate. A plurality of lift pins are slidably received within the substrate support and are configured to seat the substrate on the substrate support prior to deposition of the material layer and unseat after deposition of the material layer. A support member is arranged within the lower chamber of the chamber body and is fixed relative to the substrate support, a shaft member is fixed relative to the support member and extending through a lower wall of the chamber body, and a lift pin actuator as described above is arranged within the lower chamber of the chamber body. The lift pin actuator is translatable along the rotation axis relative to the substrate support between a first position and a second position, the lift pins dangling below the substrate support when the lift pin actuator is in the first position, the lift pins protruding above the substrate support when the lift pin actuator is in the second position. It is contemplated that the support member nest within the lift pin actuator when the lift pin actuator is in the second position to space the support member from the substrate support and limit heating of the substrate by the support member during deposition of the material layer onto the substrate.

In addition to one or more of the features described above, or as an alternative, further examples of the semiconductor processing system may include a tube member and a lift and rotate module. The tube member may extend about the shaft member, through the lower wall of the chamber body and into the lower chamber of the chamber body, and the castellated annulus connected to an end of the tube member disposed within the lower chamber of the chamber body. The lift and rotate module may be operably connected to the substrate support by the shaft member and the support member to rotate the substrate support about the rotation axis, the lift and rotate module operably connected to the tube member to translate the lift pin actuator along the rotation axis between the first position and the second position.

In addition to one or more of the features described above, or as an alternative, further examples may include a controller with a processor disposed in communication with a memory. The memory may have instructions recorded on the memory that, when read by the processor, cause the processor to register the support member relative to the lift pin actuator about the rotation axis; translate the lift pin actuator along the rotation axis between the first position and the second position; and nest the support member within the lift pin actuator during translation of the lift pin actuator between the first position and the second position, the support member and the lift pin actuator occupying a common axial position in the second position.

A process kit for a semiconductor processing system includes a lift pin actuator as described above and a support member. The first arm and the second arm of the lift pin actuator form a first arm pair, the lift pin actuator includes a second arm pair circumferentially offset from the first arm pair, and a third arm pair circumferentially intermediate second arm pair and the first arm pair. The support member includes a hub and an arm. The arm extends radially outward from the hub, the hub has a hub width smaller than the castellated annulus to nest axially within the castellated annulus, and arm has an arm width that less than a circumferential width of the crenel to nest within radial gaps bounded between arms of each of the arm pairs.

A method of making a lift pin actuator includes forming a castellated annulus having a first merlon and a second merlon spaced apart from the first merlon by a crenel, arranging the castellated annulus along a rotation axis, connecting a first arm to the first merlon such that the first arm is tangent to the first merlon and extends outward from the castellated annulus, and connecting a second arm to the second merlon such that the second arm is tangent to the second merlon, extends outward from the annulus, and is spaced apart from the first arm by a radial gap. A pin pad is connected to the first arm and the second arm, the pin pad connected therethrough to the castellated annulus such that the pin pad spaced apart from the castellated annulus by the radial gap and radially overlaps the crenel; and lift pin actuator is thereby configured to nest a support member within the lift pin actuator during translation of the lift pin actuator along the rotation axis relative to the support member.

A material layer deposition method includes, at a lift pin actuator as described above, seating a substrate on a substrate support by translating the lift pin actuator along a rotation axis away from a substrate support fixed relative to a support member, lift pins protruding from the substrate support withdrawing into the substrate support, heating the substrate, and rotating the substrate support and the support member about the rotation axis. The substrate is exposed to a material layer precursor including a silicon-containing material, and a material layer deposited onto the substrate using the material layer precursor, wherein the material layer is an epitaxial silicon layer. The support member is thereafter registered relative to the lift pin actuator; and the substrate unseated from the substrate support by nesting the lift pin actuator about the support member, the lift pin actuator radially overlapping the support member, the lift pin actuator unseating the substrate by driving a plurality of lift pins through the substrate support.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 1:
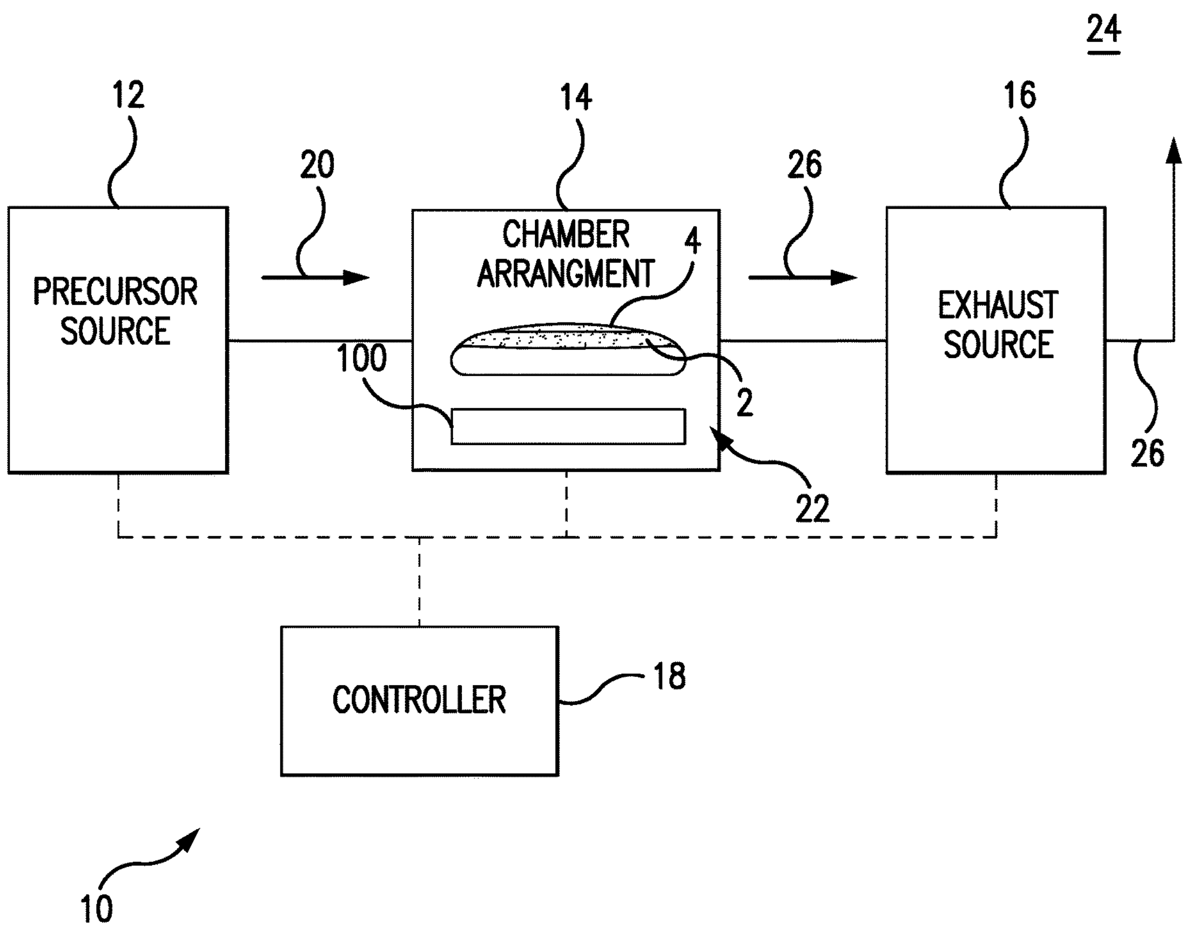
FIG. 1 is a schematic view of a semiconductor processing system in accordance with the present disclosure, showing a chamber arrangement including process kit with a lift pin actuator fluidly coupling a precursor source to an exhaust source.
Figure 14:
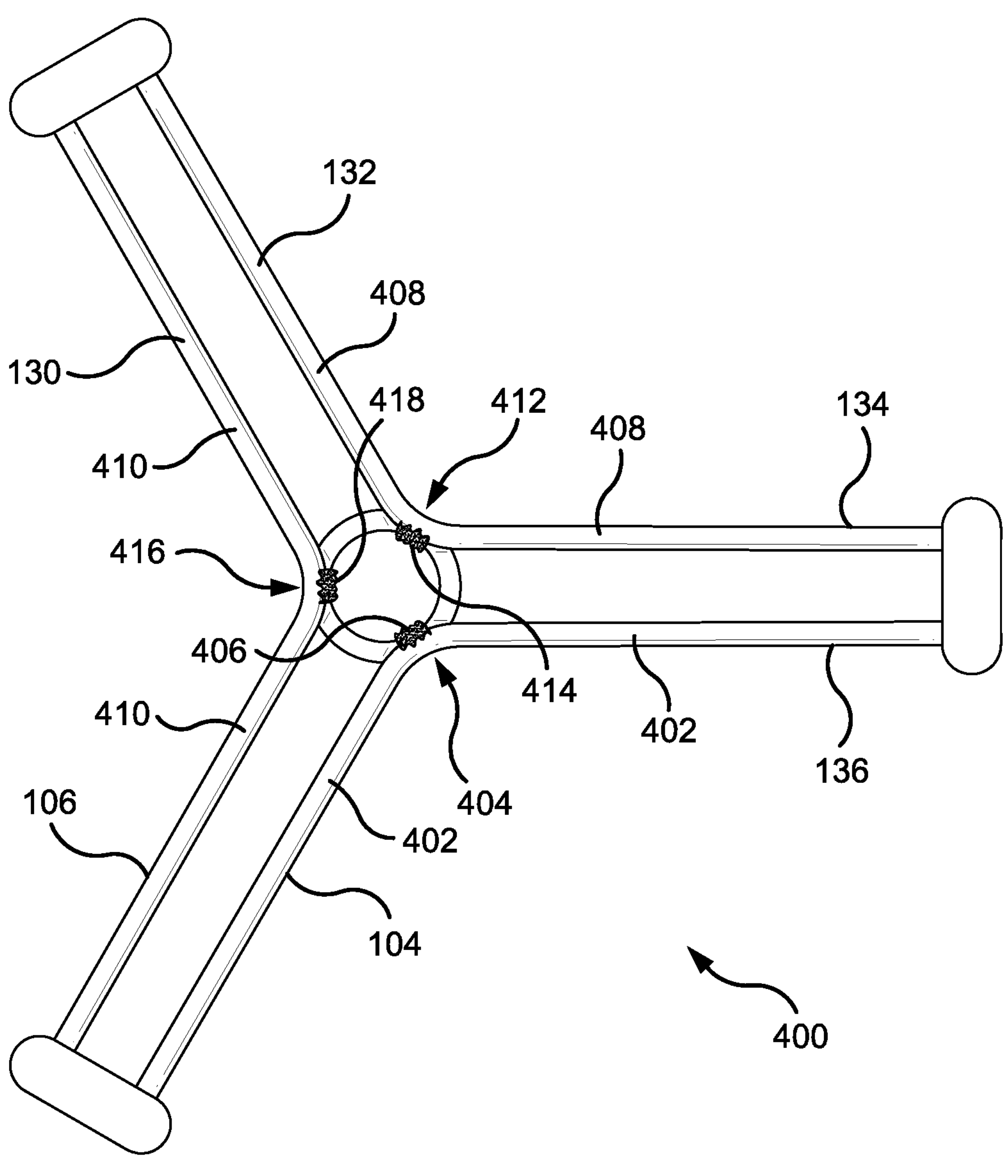
Figure 15:
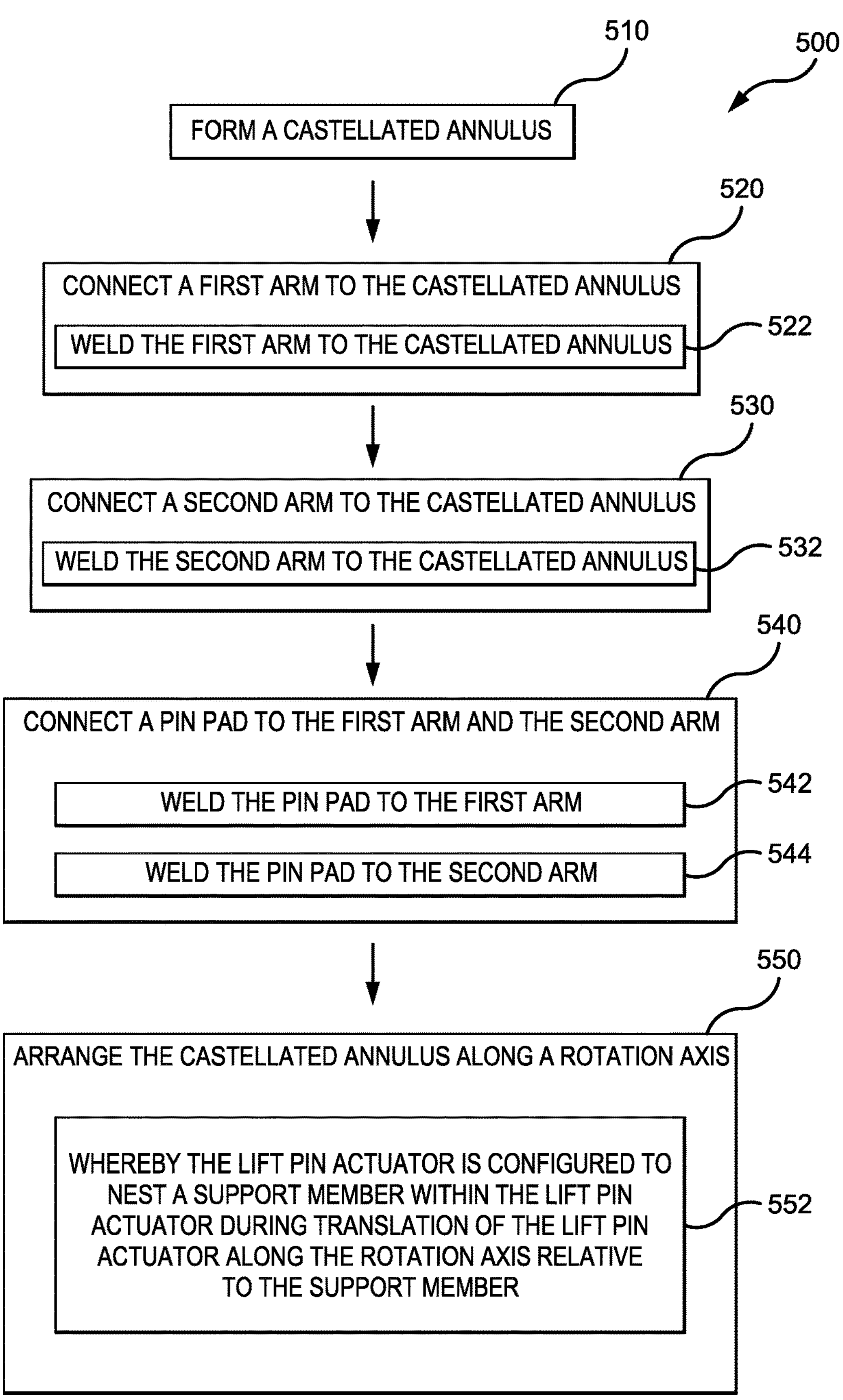
Figure 16:
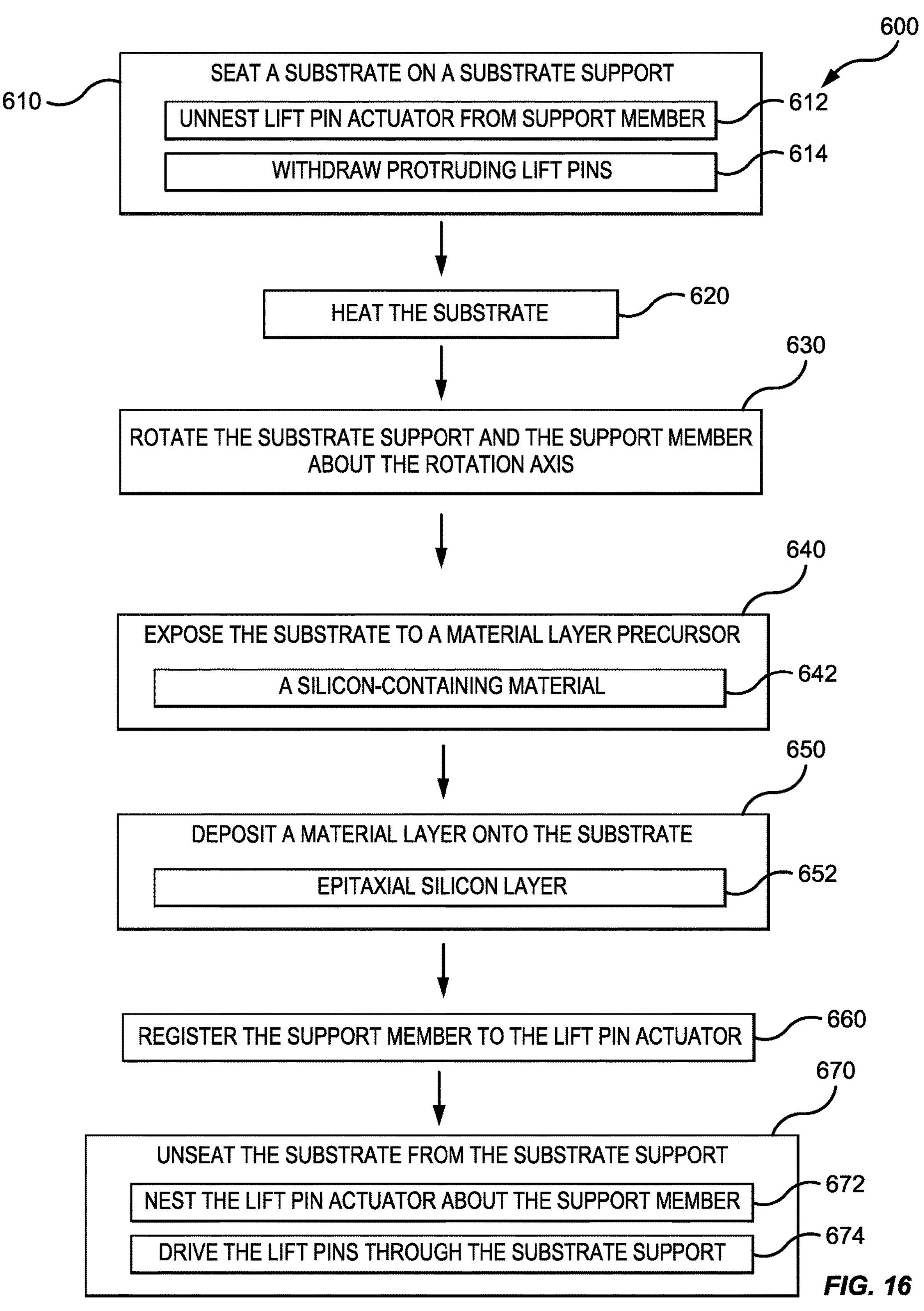

FIG. 14 is a top plan view of the lift pin actuator of FIG. 1 according to another example of the present disclosure, showing continuous arm bodies defining circumferentially adjacent arms on opposite ends of arcuate arm body segments; and FIGS. 15 and 16 are block diagrams of a method of making a lift pin actuator and a material layer deposition method, showing operations of the methods according to illustrative and non-limiting examples of the methods, respectively.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Reference will now be made to the drawings wherein like reference numerals identify similar structural features or aspects of the subject disclosure. For purposes of explanation and illustration, and not limitation, a partial view of an example of a lift pin actuator in accordance with the present disclosure is shown in FIG. 1 and is designated generally by reference character 100. Other examples of lift pin actuators, process kits, semiconductor processing systems, and related methods in accordance with the present disclosure, or aspects thereof, are provided in FIGS. 2-16, as will be described. The systems and methods of the present disclosure can be used to control the temperature of substrates during deposition of material layers onto substrates, such as during the deposition of epitaxial material layers, though the present disclosure is not limited to any particular type of material layer or to temperature control in general.

With reference to FIG. 1, a semiconductor processing system 10 is shown. The semiconductor processing system 10 includes a precursor source 12, a chamber arrangement 14, an exhaust source 16, and a controller 18. The precursor source 12 is connected to the chamber arrangement 14, includes a material layer precursor 20, and is configured provide a flow of the material layer precursor 20 to the chamber arrangement 14. The chamber arrangement 14 is connected to the exhaust source 16, includes a process kit 22 with the lift pin actuator 100, and is configured to flow the material layer precursor 20 across a substrate 2 supported therein to deposit a material layer 4 onto the substrate 2. The exhaust source 16 is fluidly coupled to an external environment 24 outside of the semiconductor processing system 10 and is configured to communicate a flow of residual material layer precursor 26 and/or reaction products to the external environment 24 outside the semiconductor processing system 10. The controller 18 is operably connected to the lift pin actuator 100 to seat and unseat substrates in the chamber arrangement 14.

The material layer precursor 20 may include a silicon-containing material. Examples of suitable silicon-containing materials include chlorinated silicon-containing precursors such as dichlorosilane ($H_2SiCl_2$) and trichlorosilane ($HCl_3Si$) as well as non-chlorinated silicon-containing precursors such as silane ($SiH_4$) and disilane ($Si_2H_6$). The material layer precursor 20 may include a germanium-containing material such as germane ($GeH_4$). The material layer precursor 20 include a dopant-containing material, such as n-type dopants like phosphorous (P) and arsenic (As) and/or p-type dopants like boron (B) and indium (In). The material layer precursor 20 may include a halide-containing material and/or a purge/carrier gas. Examples of suitable halide-containing materials include chlorine ($Cl_2$) gas and hydrochloric (HCl) acid. Examples of suitable purge/carrier gases include hydrogen ($H_2$) gas, noble gases such as helium (He) and argon (Ar), and nitrogen ($N_2$) gas.

The exhaust source 16 may be configured to maintain pressure within the chamber arrangement 14 suitable for atmospheric epitaxial deposition operations. In this respect the exhaust source 16 may be configured to maintain the substrate 2 within an environment that has a pressure between about 500 torr and about 760 torr to deposit the material layer 4 onto the substrate 2 using an atmospheric pressure epitaxial deposition technique. The exhaust source 16 may be configured to maintain pressure within the chamber arrangement 14 at a level suitable reduced pressure epitaxial deposition, for example, between about 3 torr and about 500 torr to deposit the material layer 4 onto the substrate using a reduced pressure epitaxial deposition technique.

As used herein, the term "substrate" may refer to any underlying material or materials that may be used, or upon which, a device, a circuit, or a film may be formed. The "substrate" may be continuous or non-continuous; rigid or flexible; solid or porous. The substrate may be in any form such as a powder, a plate, or a workpiece. Substrates in the form of a plate may include wafers, e.g., 300-millimeter silicon wafers, in various shapes and sizes. Substrates may be made from materials such as silicon, silicon germanium, silicon oxide, gallium arsenide, gallium nitride and silicon carbide by way of non-limiting example. Substrates may include a pattern or may be not have a pattern, such blanket-type substrates. A continuous substrate may extend beyond the bounds of a process chamber where a deposition process occurs and may move through the process chamber such that the process continues until the end of the substrate is reached. A continuous substrate may be supplied from a continuous substrate feeding system, enabling manufacture and output of the continuous substrate in any appropriate form.

Figure 2:
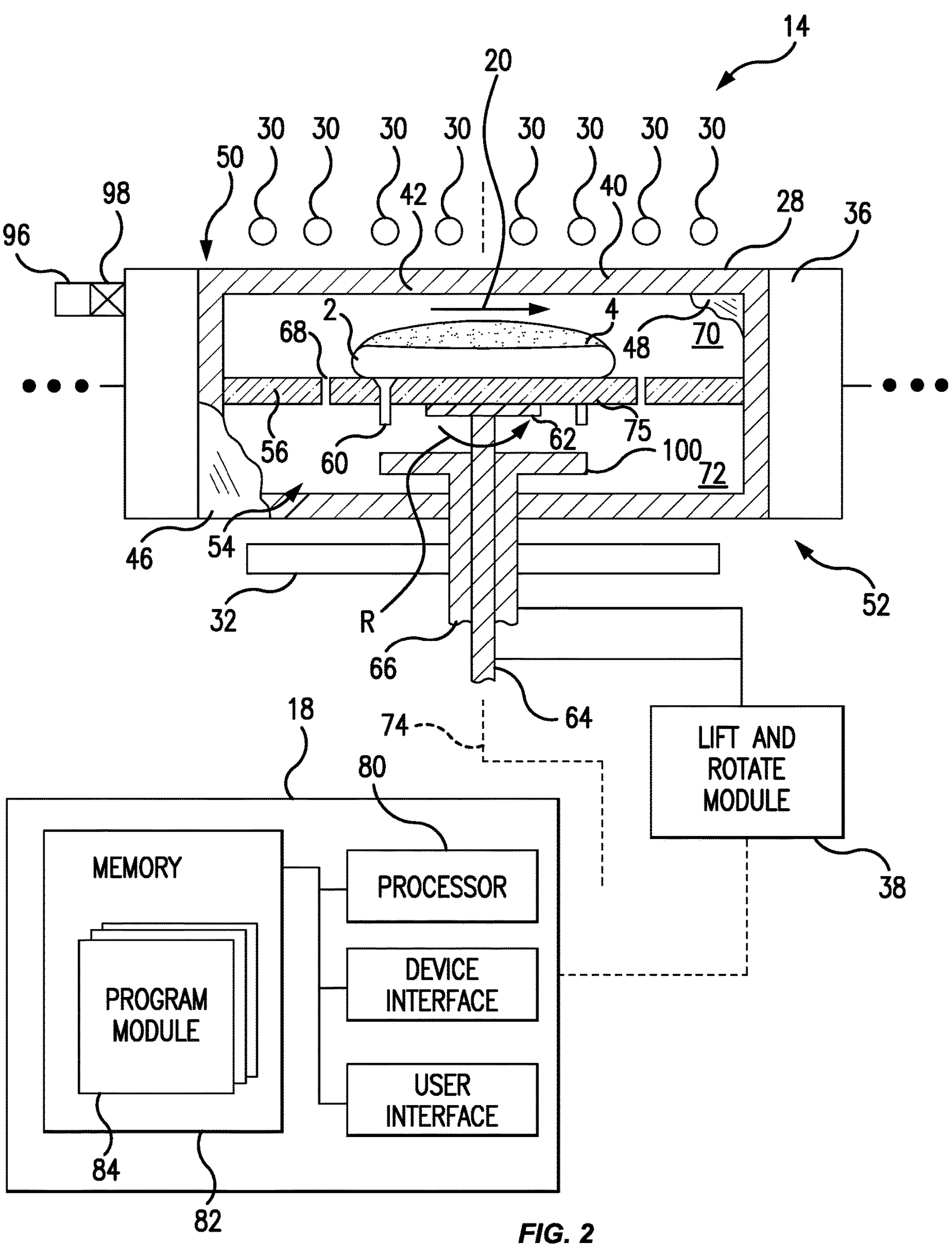
FIG. 2 is a schematic view of the chamber arrangement of FIG. 1 according to an example, showing the lift pin actuator supported for movement within a chamber body relative to the substrate support to actuate lift pins slidably received within the substrate support.

With reference to FIG. 2, the chamber arrangement 14 and the controller 18 are shown. The chamber arrangement includes a chamber body 28, an upper heater element array 30, and a lower heater element array 32, The chamber arrangement 14 also includes an injection flange 34, an exhaust flange 36, and a lift and rotate module 38. As will be appreciated by those of skill in the art in view of the present disclosure, the chamber arrangement 14 may include other elements and/or omit elements shown and described herein and remain within the scope of the present disclosure.

The chamber body 28 is formed from a transparent material 40 and includes an upper wall 42, a lower wall 44, a first sidewall 46, and second sidewall 48. The upper wall 42 extends between an injection end 50 and a longitudinally opposite exhaust end 52 of the chamber body 28. The lower wall 44 is spaced apart from the upper wall 42 by an interior 54 of the chamber body 28, extends between the injection end 50 and the exhaust end 52 of the chamber body 28, and is connected to the upper wall 42 by the first sidewall 46 and the second sidewall 48. The first sidewall 46 and the second sidewall 48 are spaced apart from one another by the interior 54 of the chamber body 28, and further extend between the injection end 50 and the exhaust end 52 of the chamber body 28. In certain examples, the transparent material 40 may include a ceramic material, such as quartz. In accordance with certain examples, the chamber body 28 may include a plurality of external ribs. It is also contemplated that the chamber body 28 may have no external ribs and remain within the scope of the present disclosure. Although shown and described herein a planar shape, either (or both) the upper wall 42 and the lower wall 44 may have an arcuate or domed shape and remain within the scope of the present disclosure.

The injection flange 34 is connected to the injection end 50 of the chamber body 28 and fluidly couples the precursor source 12 (shown in FIG. 1) to the interior 54 of the chamber body 28. The exhaust flange 36 is connected to the exhaust end 52 of the chamber body 28 and fluidly couples the interior 54 of the chamber body 28 to the exhaust source 16

(shown in FIG. 1). The upper heater element array 30 is supported above the upper wall 42 of the chamber body 28 and is configured to radiantly heat the substrate 2 by transmitting infrared electromagnetic radiation transmitted through the transparent material 40 forming the upper wall 42 of the chamber body 28. The lower heater element array 32 is supported below the chamber body 28 and is configured to radiantly heat the substrate 2 using infrared electromagnetic radiation transmitted through the transparent material 40 forming the lower wall 44 of the chamber body 28. In certain examples, the upper heater element array 30 and/or the lower heater element array 32 may include linear lamps. In accordance with certain examples, either (or both) the upper heater element array 30 and the lower heater element array 32 may include spot-type lamps.

The process kit 22 is arranged with the interior 54 of the chamber body 28 and includes a divider 56, a substrate support 58, and a plurality of lift pins 60. The process kit 22 also includes a support member 62, a shaft member 64, a tube member 66, and the lift pin actuator 100. The divider 56 is fixed within the interior 54 of the chamber body 28, has a divider aperture 68 extending therethrough, and divides the interior 54 of the chamber body 28 into an upper chamber 70 and a lower chamber 72 fluidly coupled to one another by the divider aperture 68. The substrate support 58 is supported within the divider aperture 68 for rotation R about a rotation axis 74, and is configured to seat thereon the substrate 2 during deposition of the material layer 4 onto the substrate 2. The support member 62 is arranged with the lower chamber 72 of the chamber body 28 along the rotation axis 74, and is fixed in rotation relative to the substrate support 58 about the rotation axis 74. The shaft member 64 is fixed to the support member 62 within the lower chamber 72 of the chamber body 28, extends through the lower wall 44 of the chamber body 28 along the rotation axis 74, and operably associates the lift and rotate module 38 with the substrate support 58 through the support member 62 for rotation R about the rotation axis 74. It is contemplated that the divider 56 and/or the substrate support 58 may be formed from an opaque material 75, such as a material opaque to infrared electromagnetic radiation. In this respect the divider 56 and/or the substrate support 58 may be formed from a carbonaceous material, such as silicon carbide and/or graphite. It is also contemplated that the support member 62 and/or the shaft member 64 may be formed from a transmissive material, e.g., the transparent material 40.

The plurality of lift pins 60 are slidably received within the substrate support 58 and are configured for seating and unseating substrates, e.g., the substrate 2, from an upper surface of the substrate support 58. The lift pin actuator 100 is arranged within the lower chamber 72 of the chamber body 28 along the rotation axis 74, and extends circumferentially about the shaft member 64, and is configured to drive the plurality of lift pins 60 above the upper surface of the substrate support 58 to seat and unseat substrates from the upper surface of the substrate support 58. The tube member 66 is fixed relative to the lift pin actuator 100 within the lower chamber 72 of the chamber body 28 and extends through the lower wall 44 of the chamber body 28. The tube member 66 is further translatable along the rotation axis 74 and operably associates the lift and rotate module 38 with the lift pin actuator 100 to drive the plurality of lift pins 60 using the lift pin actuator 100 to seat and unseat substrates from the substrate support 58. In certain examples the tube member 66 may be formed from a transmissive material, e.g., the transparent material 40. In accordance with certain examples, the plurality of lift pins 60 may be formed from an opaque material, e.g., the opaque material 75.

The lift and rotate module 38 may be configured to rotate the substrate support 58 about the rotation axis 74 through the shaft member 64 and the support member 62. The lift and rotate module 38 may further be configured to translate the lift pin actuator 100 along the rotation axis 74 between a first position 76 (shown in FIG. 9) and a second position 78 (shown in FIG. 11) within the lower chamber 72 of the chamber body 28 relative to the support member 62. In this respect, when the lift pin actuator 100 is in the first position 76 the lift pin actuator 100 may be spaced apart from stem portions of plurality of lift pins 60 such that the plurality of lift pins 60 dangle from the substrate support 58 within the lower chamber 72 of the chamber body 28 due to the spacing of the lift pin actuator 100 from the stem portions of the plurality of lift pins 60. In further respect, when the lift pin actuator 100 is in the second position 78, the lift pin actuator 100 may abuts ends of the plurality of lift pins 60 and be disposed axially along the rotation axis 74 such that tip portions of the plurality of lift pins 60 protrude above the substrate support 58 and into the upper chamber 70 of the chamber body 28. In certain examples, movement of the lift pin actuator 100 between the first position 76 and the second position 78 using the lift and rotate module 38 may be accomplished by operative connection of the controller 18 to the lift and rotate module 38. In this respect the controller 18 may include a processor 80 disposed in communication with a memory 82 including a non-transitory machine-readable medium having a plurality of program modules 84 recorded thereon containing instructions that, when read by the processor 80, cause the processor 80 to execute certain operations. Among the operations are operations of a material layer deposition method 500 (shown in FIG. 16), as will be described.

As has been explained above, heat absorbed by support members, in some material layer deposition operations, locally influence temperature of substrates support on substrate supports. Without being bound by a particular theory or mode of operation, it is believed that heat absorbed by the substrate support during deposition of a material layer onto a substrate seated on the substrate support may cause a surface portion of the substrate overlying the substrate support to run hotter than other surface portions of the substrate, causing the material layer to differ in thickness at locations axially overlaying the substrate support in relation to other locations. In some material layer deposition operations, the thickness variation may be such that semiconductor devices formed at locations overlying the support member may perform differently than semiconductor devices formed at other locations on the substrate. To limit (or eliminate) thickness variation in the material layer 4 deposited onto the substrate 2 associated with heating of the support member 62, the lift pin actuator 100 is provided.

Figure 3:
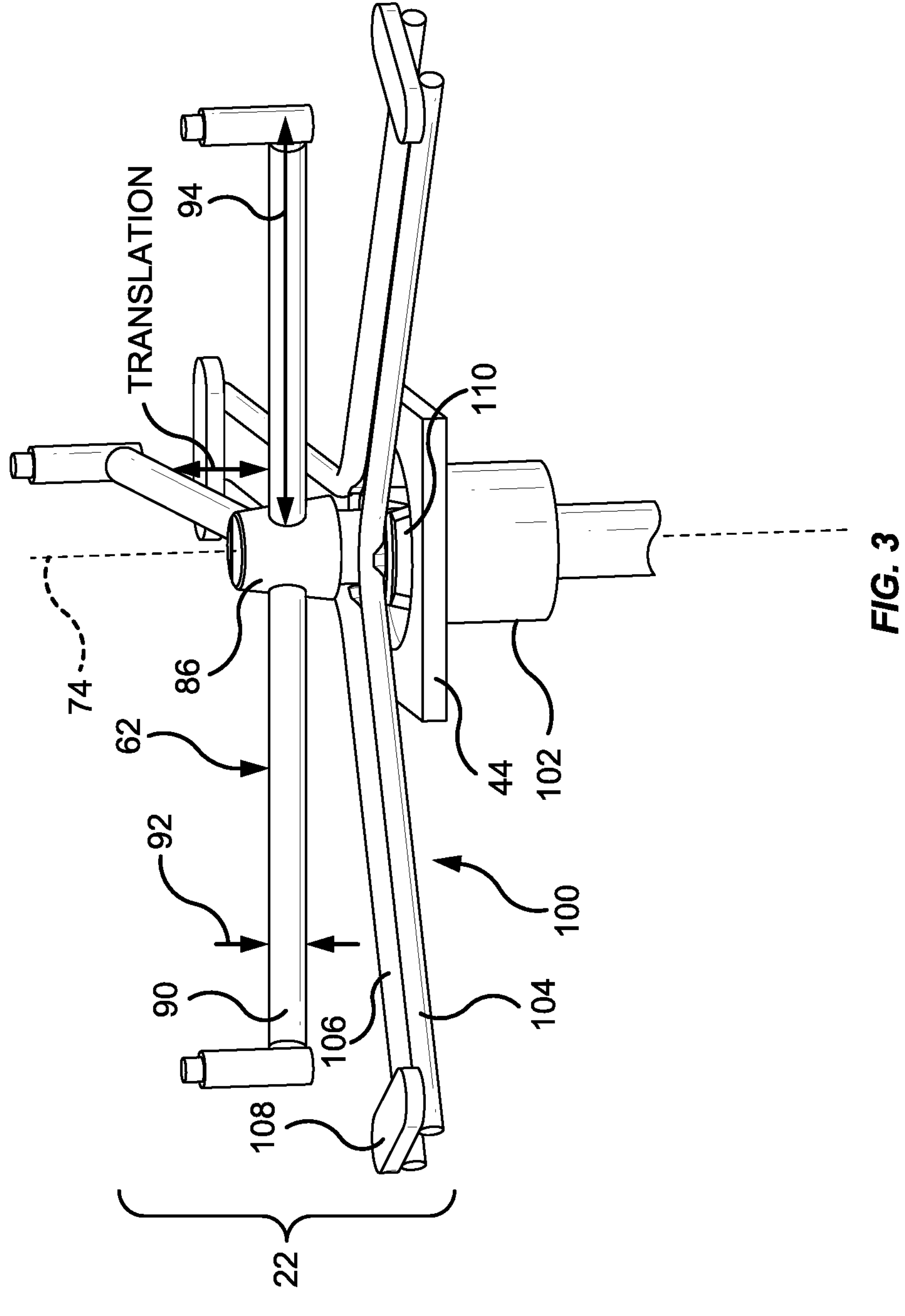
FIG. 3 is a perspective view of the process kit of FIG. 1 according to an example of the present disclosure, showing a support member configured to nest within the lift pin actuator when the lift pin actuator is translated relative to the support member along a rotation axis.

With reference to FIG. 3, the lift pin actuator 100 is shown. The lift pin actuator 100 includes a castellated annulus 102, a first arm 104, a second arm 106, and a pin pad 108. The castellated annulus 102 is arranged along the rotation axis 74 and has a first merlon 110 and a second merlon 112 (shown in FIG. 4) circumferentially spaced apart from one another by a crenel 114 (shown in FIG. 4). The first arm 104 is connected to the first merlon 110 and extends outward from the castellated annulus 102 in a direction opposite the rotation axis 74. The second arm 106 is connected to the second merlon 112, extends outward from the castellated annulus 102 in a direction opposite the rotation axis 74, and is spaced from the first arm 104 by a radial gap 116 (radial gap). The pin pad 108 is connected to the castellated annulus 102 by both the first arm 104 and the second arm 106, is spaced apart from the castellated annulus 102 by the radial gap 116, and radially overlaps the crenel 114 such that the support member 62 can nest within the lift pin actuator 100 during translation of the lift pin actuator 100 along the rotation axis 74 relative to the support member 62.

The support member 62 may be configured to nest within the lift pin actuator 100. In this respect it is contemplated that the lift pin actuator 100 and the support member 62 occupy a common axial location along the rotation axis 74 during movement between the first position 76 (shown in FIG. 9) and the second position 78 (shown in FIG. 11), the lift pin actuator 100 nesting and radially overlapping the support member 62 in the second position 78. The nesting and radial overlap at the common axial position may be such that the support member 62 may be axially spaced further from the substrate support 58 along the rotation axis 74 than otherwise possible in a serial arrangement. In certain examples, the axial spacing may be such that heating of the substrate 2 (shown in FIG. 1) by the substrate support 58 is smaller than in serial arrangement due to heat transmitted by the support member 62 into regions of the substrate 2 overlying the support member 62 through the substrate support 58, limiting (or eliminating) localized thickness variation associated due to the heat. In certain examples, a hub of the support member 62 may be closer to the lower wall 44 (shown in FIG. 2) of the chamber body 28 (shown in FIG. 2) than the substrate support 58. In accordance with certain examples, an axial separation distance between the hub of the support member 62 from the lower wall 44 may be less than half an axial distance between the hub the substrate support 58.

In certain examples, a hub 86 of the support member 62 may have a hub width 88 (shown in FIG. 7) that is smaller than an inner diameter 186 (shown in FIG. 7) defined within the castellated annulus 102. In accordance with certain examples, the hub 86 may have an arm 90 with an arm width 92 that is smaller than a circumferential width 188 (shown in FIG. 7) of the crenel 114. It is also contemplated that, in accordance with certain examples, the arm 90 may have an arm radial length 94 that is greater than a radial depth 190 defined of the radial gap 116 (e.g., between the castellated annulus 102 and the first pin pad 108). As will be appreciated by those of skill in the art in view of the present disclosure, this allows the lift pin actuator 100 to nest (e.g., radially overlap the support member 62 along the rotation axis 74) within the lift pin actuator 100 when the lift pin actuator 100 moves between the first position 76 (shown in FIG. 9) and the second position 78 (shown in FIG. 11).

Figure 4:
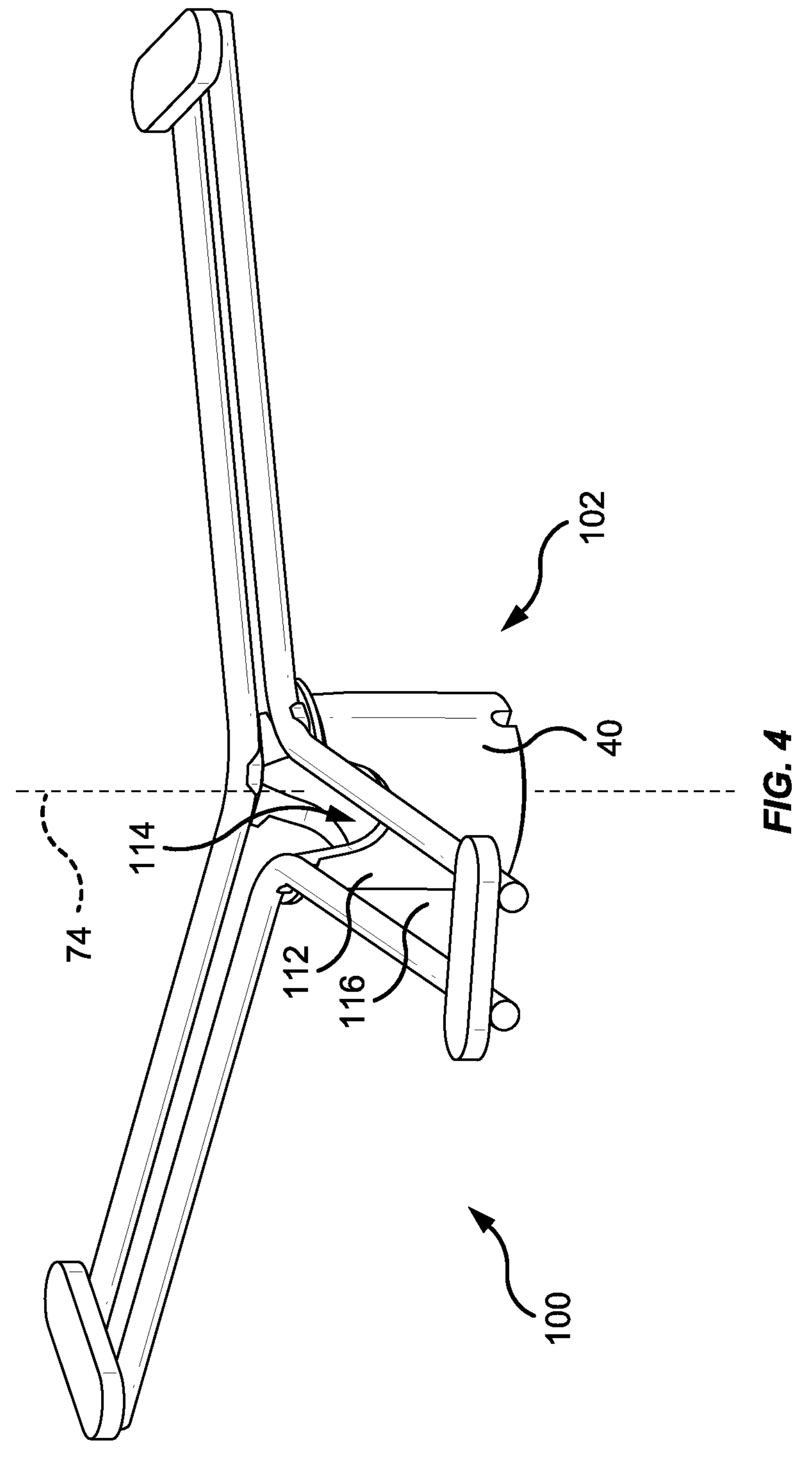
FIG. 4 is a perspective view of the of the lift pin actuator of FIG. 1 according to an example of the present disclosure, showing castellated annulus arranged along a rotation axis and arm pairs extending outward from the castellated annulus in a directed opposite the rotation axis.

With reference to FIG. 4, the lift pin actuator 100 may be formed from a material transparent to infrared electromagnetic radiation. For example, the lift pin actuator 100 may be formed from the transparent material 40. In certain examples, the lift pin actuator 100 may be homogenous in composition, the lift pin actuator 100 consisting of (or consisting essentially of) the transparent material 40. In accordance with certain examples, the lift pin actuator 100 may be formed form quartz. It is also contemplated that, in accordance with certain examples, that one or more of the arms of the lift pin actuator 100 may be formed from cylindrical stock, such cylindrical stock having diameter that is substantially equivalent to a wall thickness of the castellated annulus 102. As will be appreciated by those of skill in the art in view of the present disclosure, forming the lift pin actuator 100 from quartz limits shading that may otherwise be associated with structure of the lift pin actuator 100, reducing shading of the underside of the substrate support 58 from infrared electromagnetic radiation communicated by the lower heater element array 32 (shown in FIG. 2) into the lower chamber 72 (shown in FIG. 2) of the chamber body 28 (shown in FIG. 2). As will also be appreciated by those of skill in the art in view of the present disclosure, forming one or more of the arms of the lift pin actuator 100 from cylindrical stock may limit scattering of infrared electromagnetic radiation illumination transmitted into the lower chamber 72 (shown in FIG. 2) of the chamber body 28 (shown in FIG. 2), limiting the effect that such scattered light may have on controlling temperature within the reactor, such as in examples where a pyrometer is employed to monitor temperature of the lower surface of the substrate support 58 (shown in FIG. 2).

Figure 5:
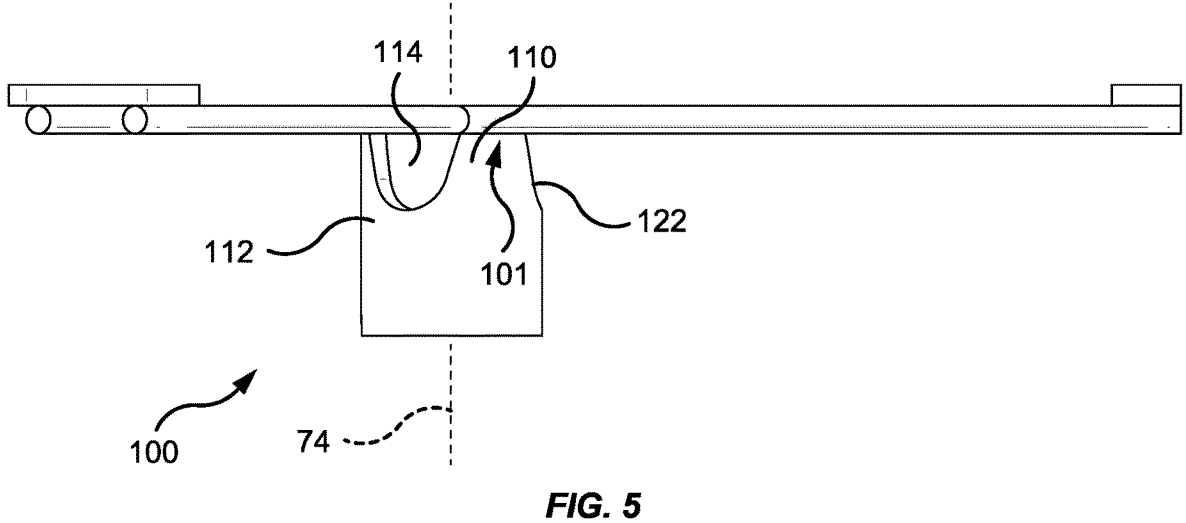
FIGS. 5 and 6 are side elevation views of the lift pin actuator of FIG. 1 according to an example of the present disclosure, both showing merlons defined by the annulus supporting the arm pairs and circumferentially spaced apart from one another by crenels.
Figure 6:
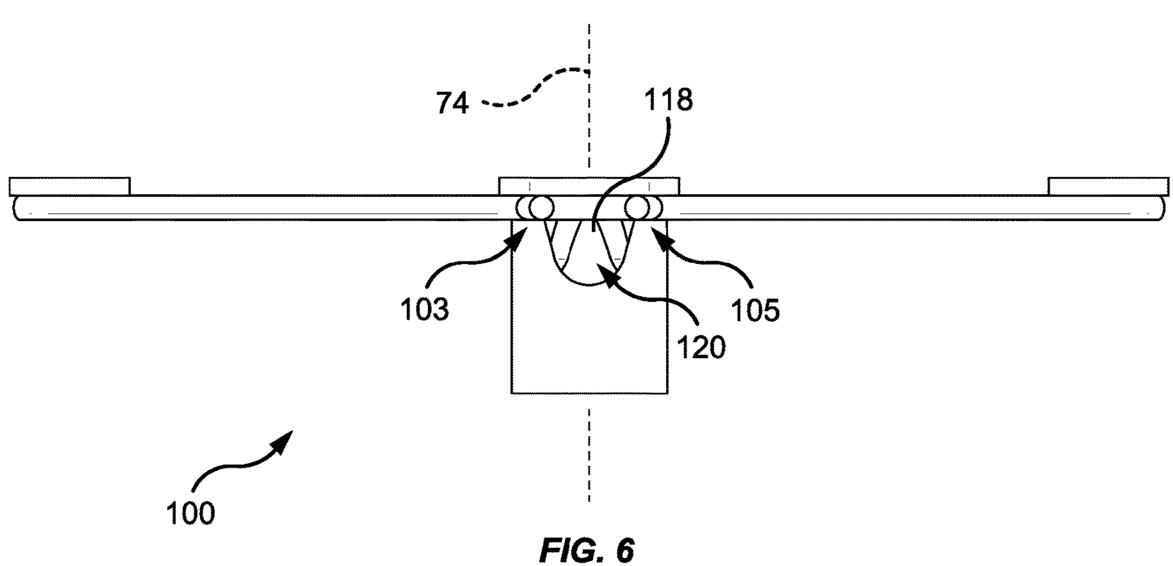

With reference to FIGS. 5 and 6, the castellated annulus 102 may have three (3) merlons circumferentially spaced apart from one another by three (3) crenels. In this respect the castellated annulus 102 may have a third merlon 118 separating the second merlon 112 from the first merlon 110, the third merlon 118 may be circumferentially separated from the second merlon 112 by a second crenel 120, and the third merlon 118 may be further separated from the first merlon 110 by a third crenel 122. The first crenel 114 may circumferentially separate the first merlon 110 from the second merlon 112, the second crenel 120 may circumferentially separate the third merlon 118 from the second merlon 112, and the third crenel 122 may circumferentially separate the third merlon 118 from the first merlon 110. The third merlon 118 may be circumferentially spaced from the second merlon 112 by the second crenel 120. The third merlon 118 may be further circumferentially spaced from the first merlon 110 by the third crenel 122. Although shown and described herein as having three (3) merlons, it is to be understood and appreciated that the lift pin actuator 100 may have fewer or additional merlons and crenels than shown and described herein and remain within the scope of the present disclosure.

Figure 7:
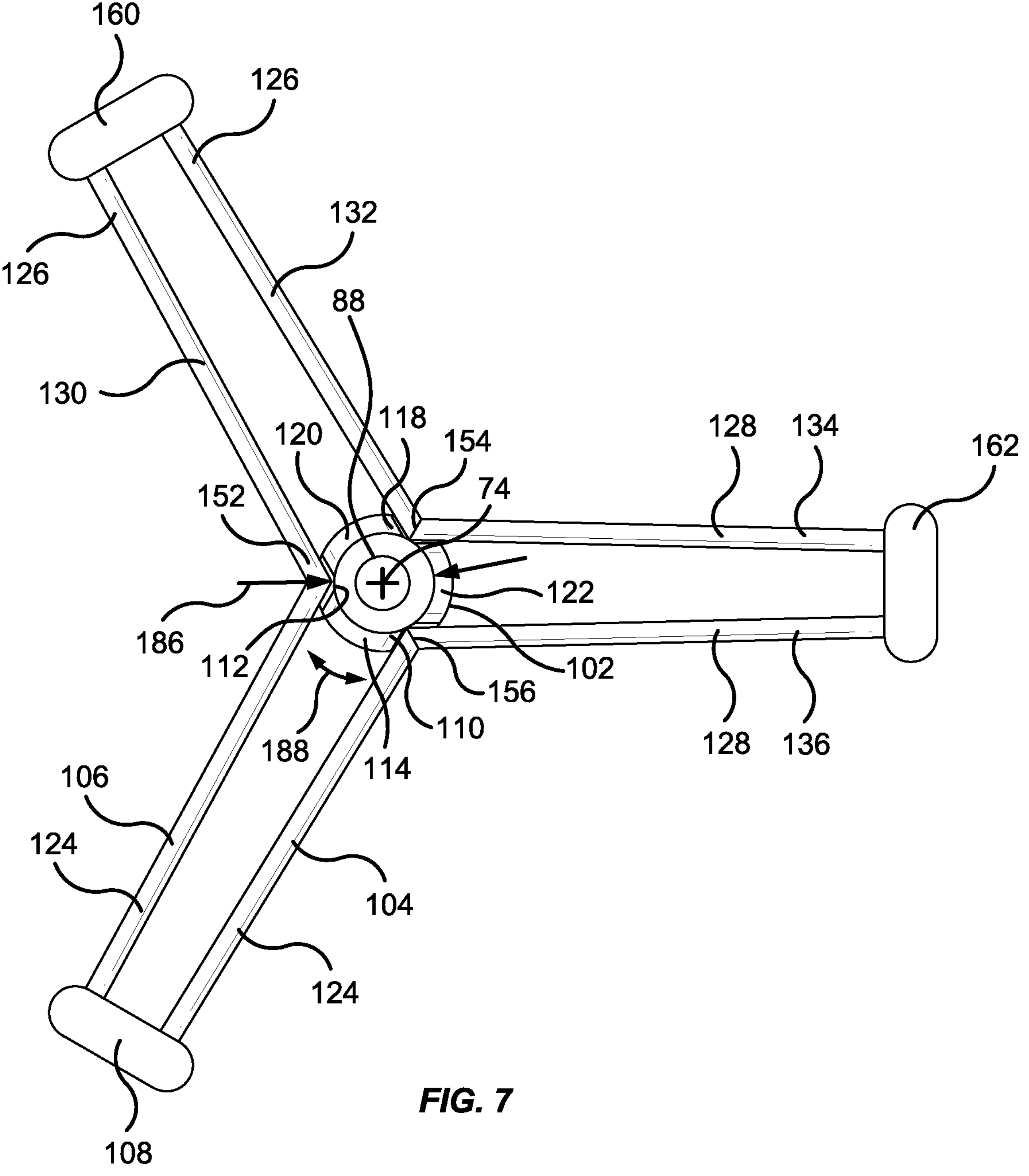
FIGS. 7 and 8 are bottom and top plan views of the lift pin actuator of FIG. 1 according to an example of the present disclosure, showing arms butt welded to one another and onto the merlons of the castellated annulus and pin pads welded at their undersides to the arm pairs of the lift pin actuator, respectively.

With reference to FIG. 7, the lift pin actuator 100 may include three (3) arm pairs. In this respect the first arm 104 and the second arm 106 may form a first arm pair 124, and the lift pin actuator 100 may have a second arm pair 126 and a third arm pair 128. The second arm pair 126 may include a third arm 130 and a fourth arm 132, may extend outward from the castellated annulus 102 in a direction opposite the rotation axis 74, and may be further circumferentially offset from the first arm pair 124. The third arm pair 128 may include a fifth arm 134 and a sixth arm 136, may also extend outward from the castellated annulus 102 is a directed opposite the rotation axis 74, and may also be circumferentially intermediate the second arm pair 126 and the third arm pair 128. In certain examples, the arm pairs may be symmetrically distributed about the rotation axis 74. For example, the second arm pair 126 may be circumferentially offset about the rotation axis 74 from the first arm pair 124 by about 120 degrees, and the third arm pair 128 may be circumferentially offset from both the second arm pair 126 and the first arm pair 124 by about 120 degrees about the rotation axis 74. It is also contemplated that one or more of the arm pairs may be asymmetrically offset from another of the arm pairs about the rotation axis 74 and remain within the scope of the present disclosure.

Figure 8:
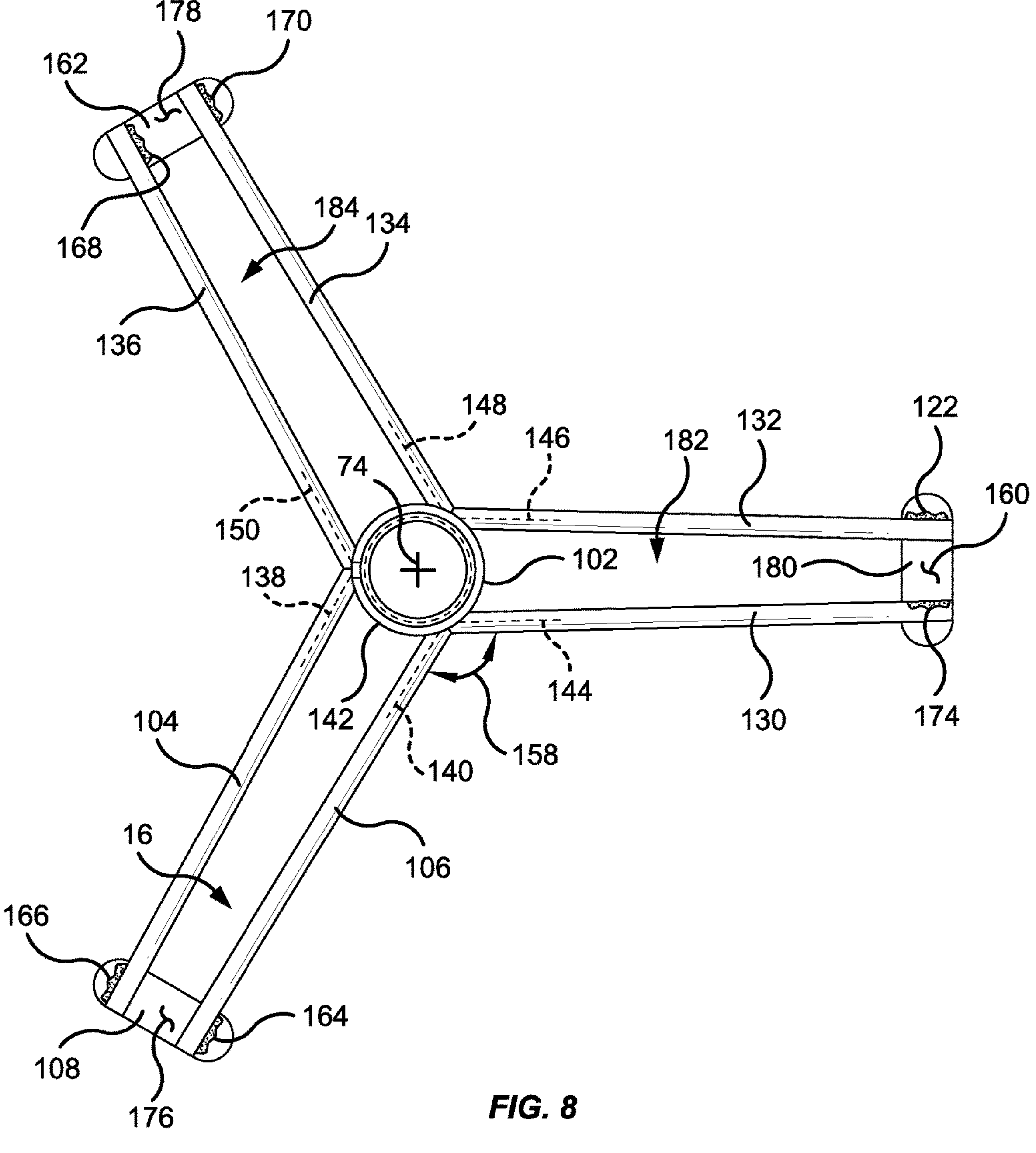

With reference to FIG. 8, one or more of the arms of lift pin actuator 100 may be tangent relative to the castellated annulus 102. In this respect the first arm 104 may define a first arm axis 138, the second arm 106 may define a second arm axis 140, and the first arm axis 138 and the second arm axis 140 may both be tangent to a circumference 142 defined by the castellated annulus 102. The third arm 130 may define a third arm axis 144 and the fourth arm 132 may define a fourth arm axis 146, and the third arm axis 144 and the fourth arm axis 146 may also be tangent to the circumference 142. The fifth arm 134 may define a fifth arm axis 148, the sixth arm 136 may define a sixth arm axis 150, and the fifth arm axis 148 and the sixth arm axis 150 may further be tangent to the circumference 142. In certain examples, the first arm axis 138 may be oblique relative to the second arm axis 140, the third arm axis 144 may be oblique relative to the fourth arm axis 146, and the fifth arm axis 148 may be oblique relative to the sixth arm axis 150. In accordance with certain examples, one or more of the arm axes may be skew relative to the rotation axis 74. For example, the first arm axis 138 and/or the second arm axis 140 may be skew relative to the rotation axis 74. It is also contemplated that the third arm axis 144 and/or the fourth arm axis 146 may be skew relative to the rotation axis 74, and that the fifth arm axis 148 and/or the sixth arm axis 150 may be skew relative to the rotation axis 74.

With continuing reference to FIG. 7, circumferentially adjacent arms from different arm pairs may extend outward from a common merlon. For example, the second arm 106 and the third arm 130 may extend outward from the second merlon 112, the fourth arm 132 and the fifth arm 134 may extend outward from the third merlon 118, and sixth arm 136 and the first arm 104 may extend outward from the first merlon 110. The fourth arm 132 may be circumferentially spaced from the first arm 104 by the first crenel 114 and the second crenel 120, the sixth arm 136 may be circumferentially spaced from the third arm 130 by the second crenel 120 and the third crenel 122, and the second arm 106 may be circumferentially spaced from the fifth arm 134 by the first crenel 114 and the third crenel 122. It is also contemplated that the two or more of the arm may define an obtuse angle outside of the annulus, for example, an obtuse angle 158 (shown in FIG. 8) defined between the second arm 106 and the third arm 130 at a location radially outward of the second merlon 112.

In certain examples, the lift pin actuator 100 may be formed as a weldment. In this respect the second arm 106 and the third arm 130 may be connected to the second crenel 120 by a first axial weld 101 (shown in FIG. 5), the fourth arm 132 and the fifth arm 134 may be connected to the third crenel 122 by a second axial weld 103 (shown in FIG. 6), and the sixth arm 136 and the first arm 104 may be connected to the first crenel 114 by a third axial weld 105 (shown in FIG. 6). In further respect, the second arm 106 may be connected to the third arm 130 by a first butt weld 152 overlying the second crenel 120, the fourth arm 132 and the fifth arm 134 may be connected to one another by a second butt weld 154 overlying the third crenel 122, and the sixth arm 136 and the first arm 104 may be connected to one another by a third butt weld 156 overlying the first crenel 114. As will be appreciated by those of skill in the art in view of the present disclosure, forming the lift pin actuator 100 as a weldment may simplify fabrication of the lift pin actuator 100, for example, by allowing the lift pin actuator 100 to be formed from standard sizes of quartz plate, tube, and/or bar stock.

With continuing reference to FIG. 8 and referring once again to FIG. 7, the pin pad 108 may be a first pin pad 108 and the lift pin actuator 100 may include a second pin pad 160 and a third pin pad 162. The first pin pad 108 may be axially spaced along the rotation axis 74 from the castellated annulus 102 by the first arm 104 and the second arm 106. The second pin pad 160 may be axially spaced along the rotation axis 74 from the castellated annulus 102 by the third arm 130 and the fourth arm 132. The third pin pad 162 may be axially spaced from the castellated annulus 102 along the rotation axis 74 by the fifth arm 134 and the sixth arm 136. It is contemplated that the second pin pad 160 may be circumferentially offset from the first pin pad 108 about the rotation axis 74, and that the third pin pad 162 may be circumferentially intermediate the second pin pad 160 and the first pin pad 108.

The first pin pad 108 may be connected to the first arm 104 by a first arm weld 164 and to the second arm 106 by a second arm weld 166. The second pin pad 160 may be connected to the third arm 130 by a third arm weld 168 and connected to the fourth arm 132 by a fourth arm weld 170. The third pin pad 162 may be connected to the fifth arm 134 by a fifth arm weld 172 and connected to the sixth arm 136 by a sixth arm weld 174. The first arm weld 164 and the second arm weld 166 may be located on an first pin pad underside 176 of the first pin pad 108, the third arm weld 168 and the fourth arm weld 170 may be located on a second pin pad underside 178 of the second pin pad 160, and the fifth arm weld 172 and the sixth arm weld 174 may be located on a third pin pad underside 180 of the third pin pad 162 to connect the third pin pad 162 to the third arm pair 128. Advantageously, forming the welds (164-174) on the undersides of the pin pads (108, 160 and 162) may also simplify fabrication of the lift pin actuator 100, for example, by allowing pin pads to be shimmed to a common offset from a lower edge of the castellated annulus 102 prior to welding.

In certain examples, each of the pin pads (108, 160 and 162) may be radially spaced apart from the castellated annulus 102 by a radial gap. In this respect the radial gap 116 may be a first radial gap 116 defined by the first arm pair 124, the second arm pair 126 may define a second radial gap 182, and the third arm pair 128 may define a third radial gap 184. The first radial gap 116 may radially space the first pin pad 108 from the castellated annulus 102, and may radially overlap the first crenel 114. The second radial gap 182 may radially space the second pin pad 160 from the castellated annulus 102, and may radially overlap the second crenel 120. The third radial gap 184 may radially space the third pin pad 162 from the castellated annulus 102, and may radially overlap the third crenel 122. It is contemplated that each of the radial gaps may have a radial width greater than radial widths of arms of the support member 62 (shown in FIG. 2), arms of the support member 62 thereby extending through the crenel and nesting (at least partially) within the radial gaps defined by the arm pairs and bounded by pin pads when the lift pin actuator 100 moves between first position 76 (shown in FIG. 9) and the second position 78 (shown in FIG. 11).

Figure 9:
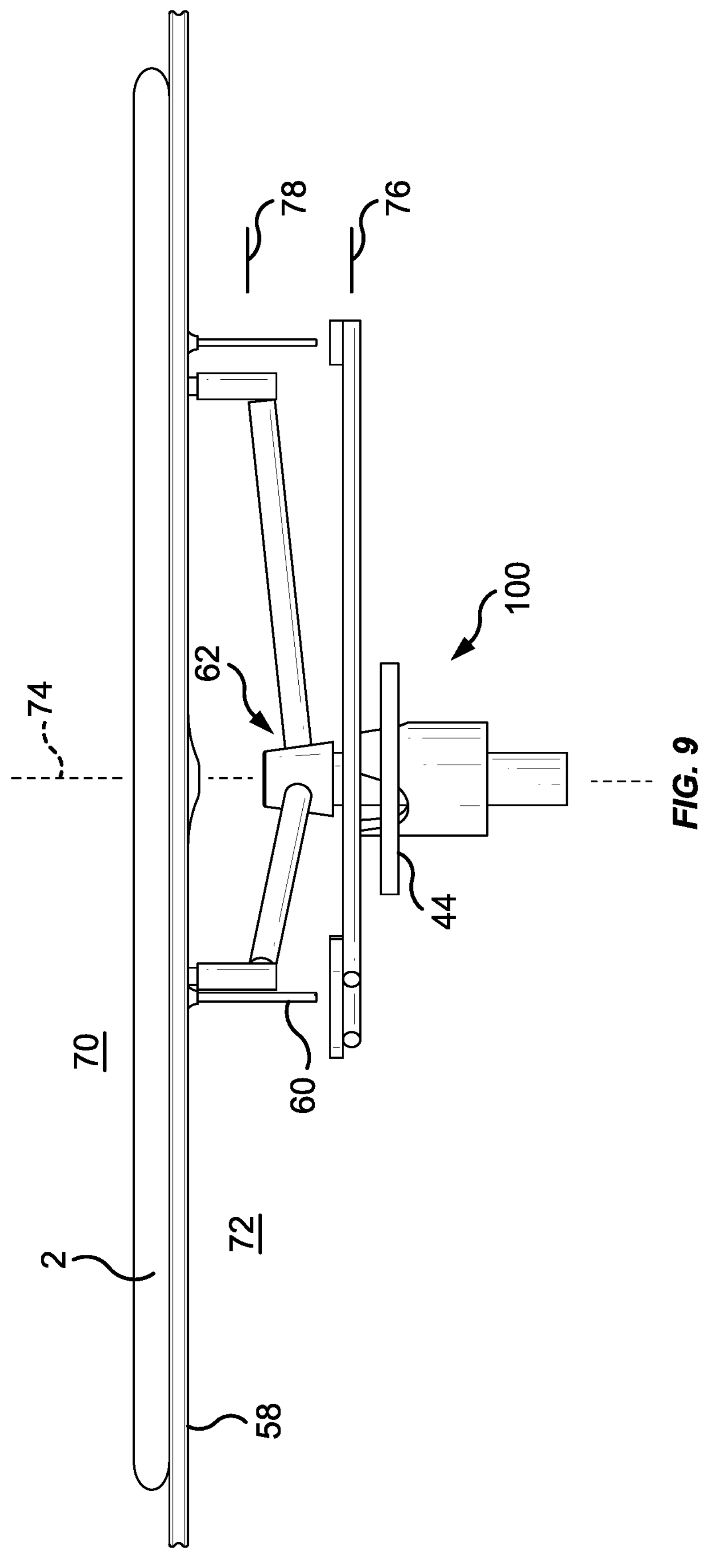
FIGS. 9-11 are side elevation view of a portion of the chamber arrangement of FIG. 1 according to an example of the present disclosure, sequentially showing the lift pin actuator translating along the rotation axis relative to the support member to drive lift pins slidably received within a substrate support carried by the support member and nesting about the support member.
Figure 10:
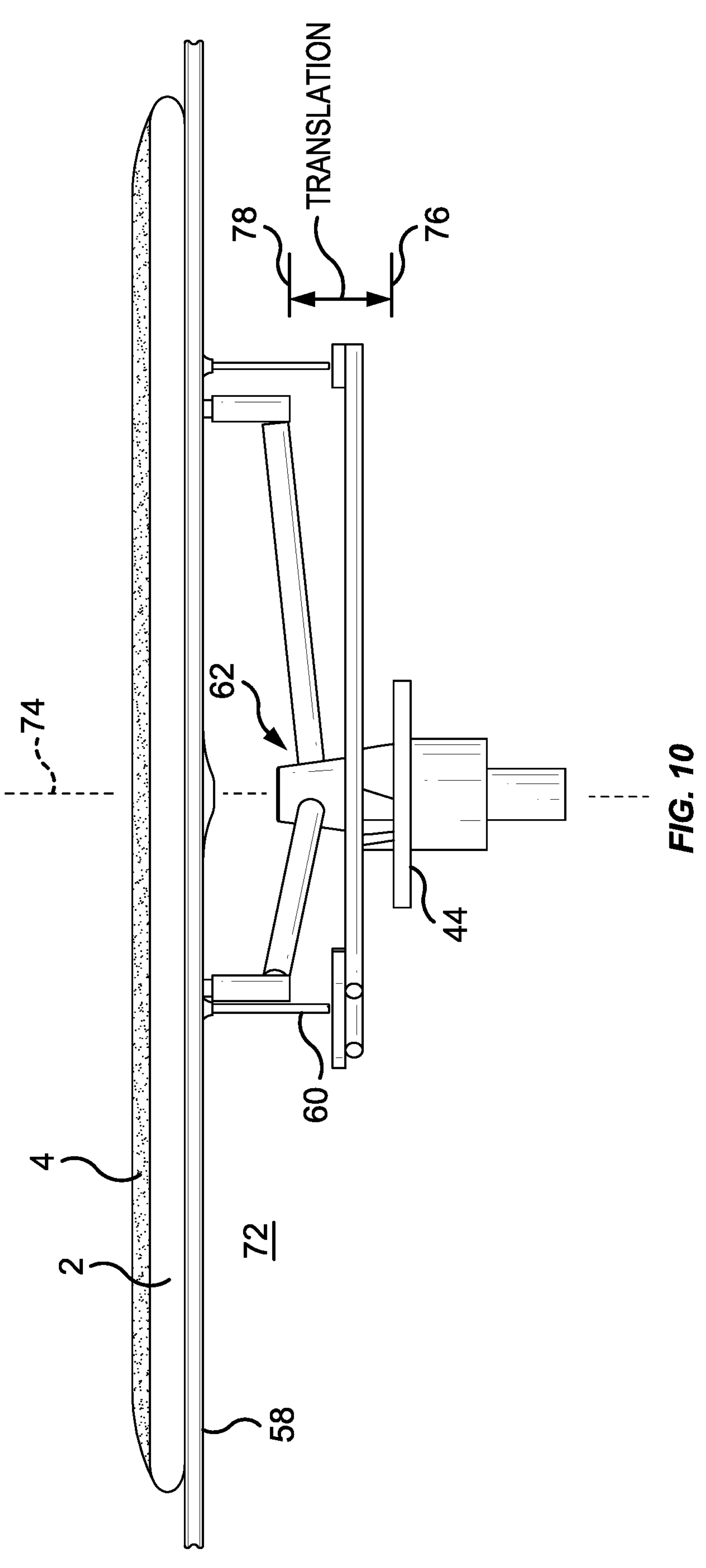
Figure 11:
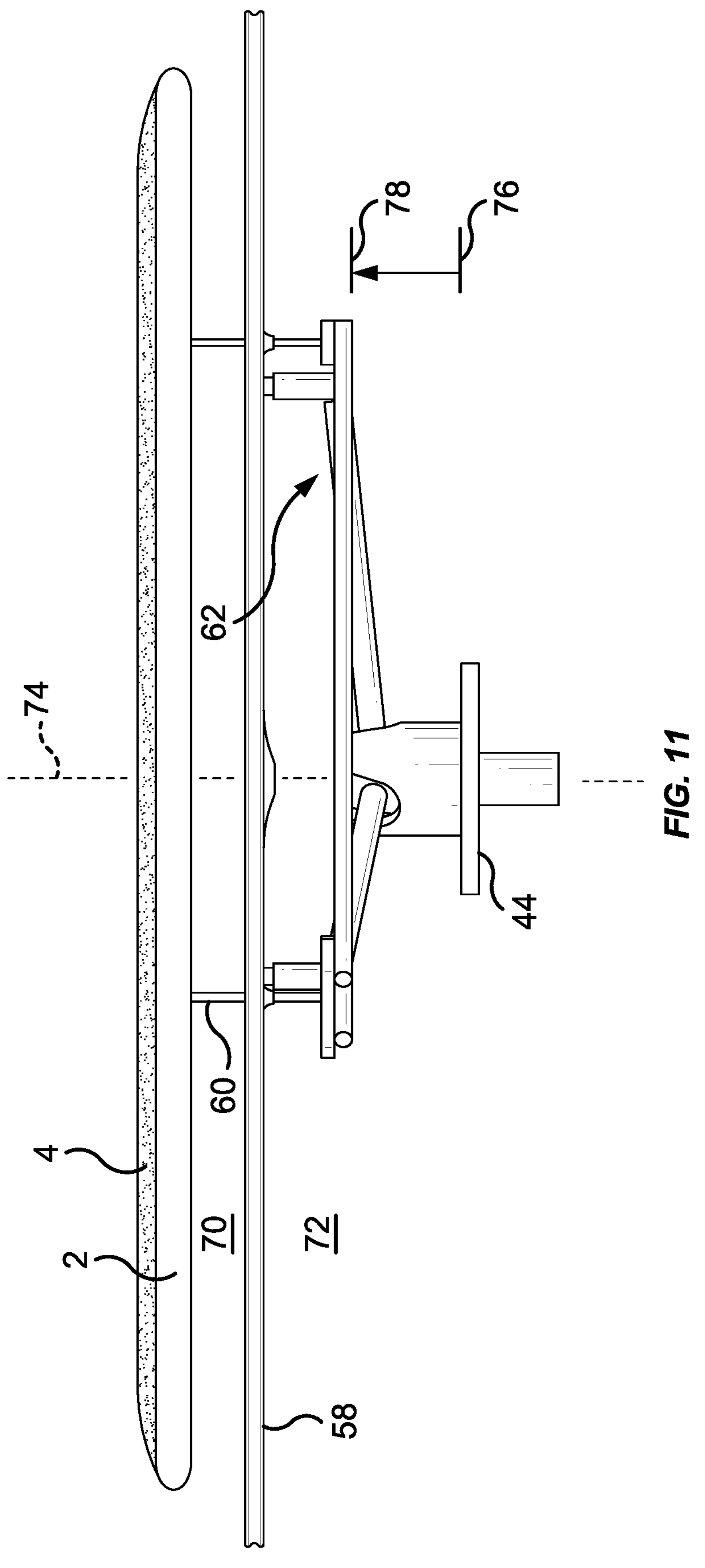

With reference to FIGS. 9-11, movement of the lift pin actuator 100 relative to the support member 62 and the substrate support 58 within the lower chamber 72 of the chamber body 28 (shown in FIG. 2) is shown. As shown in FIG. 9, deposition of the material layer 4 onto the substrate 2 is accomplished with the lift pin actuator 100 disposed in the first position 76. When in the first position 76 the first arm 104 and the pin pad 108 of the lift pin actuator 100 are disposed axially along the rotation axis 74 between the substrate support 58 and the lower wall 44 of the chamber body 28, the castellated annulus 102 is at least partially within the lower chamber 72 of the chamber body 28, and at least a portion of the castellated annulus 102 may be axially located below the lower wall 44 of the chamber body 28. It is contemplated that deposition of the material layer 4 be accomplished by heating the substrate 2 using the upper heater element array 30 and the lower heater element array 32, that the substrate support 58 and the substrate 2 be rotated about the rotation axis 74 by the lift and rotate module 38 (shown in FIG. 2), and that the substrate be exposed to the material layer precursor 20.

As shown in FIG. 10, once the material layer 4 has been deposited onto the substrate 2, flow of the material layer precursor 20 ceases, heating of the substrate 2 may cease, and the substrate support 58 is registered in rotation relative to the lift pin actuator 100. More specifically, the substrate support 58 is registered in rotation about the rotation axis 74 such that each of the plurality of lift pins 60 axially overly one the pin pads (108, 160 and 162) of the lift pin actuator 100. Registration may be accomplished by the lift and rotate module 38 (shown in FIG. 2), which rotates the substrate support 58 relative to the lift pin actuator 100 through the shaft member 64 and the support member 62. Once the substrate support 58 is registered to the lift pin actuator 100 the lift pin actuator 100 is translated along the rotation axis 74 upwards within the lower chamber 72 of the chamber body 28 (shown in FIG. 2), the pin pads (108, 160 and 162) of the lift pin actuator 100 thereby coming into abutment with ends of the plurality of lift pins 60. Upward translation of the lift pin actuator 100 along the rotation axis 74 may be accomplished by the lift and rotate module 38, which may translate the lift and rotate module 38 using the tube member 66 (shown in FIG. 2).

As shown in FIG. 11, once brought into abutment with the plurality of lift pins 60, the lift pin actuator 100 is further translated upwards within the lower chamber 72 of the chamber body 28 (shown in FIG. 2) relative to the substrate support 58 to the second position 78. As the lift pin actuator 100 translates upwards along the rotation axis 74 stem portions of the plurality of lift pins 60 slide upwards, through the substrate support 58, comes in to abutment with a lower surface of the substrate 2, and unseat the substrate 2 the from the substrate support 58 such that the substrate 2 is supported within the upper chamber 70 of the chamber body 28 by the plurality of lift pins 60. So supported, a substrate transfer robot 96 (shown in FIG. 2) may retrieve the substrate 2 through a gate valve 98 (shown in FIG. 2), and a further substrate placed on the plurality of lift pins 60 protruding above the substrate support 58. Notably, as the lift pin actuator 100 approaches the second position 78, the lift pin actuator 100 nests about the support member 62. In this respect the hub 86 of the support member 62 may be received within the castellated annulus 102, the arm 90 of the support member 62 may extend through the first crenel 114, and arm 90 may further traverse the first radial gap 116 at a location radially inward of the first pin pad 108, the support member 62 thereby nesting within the lift pin actuator 100 in the second position 78. Advantageously, configuring the lift pin actuator 100 to nest about the support member 62 allows the support member 62 to spaced proximate the lower wall 44 of the chamber body 28, limiting influence that the support member 62 could otherwise have on temperature variation across the substrate 2 during deposition of the material layer 4 onto the substrate 2.

Figure 12:
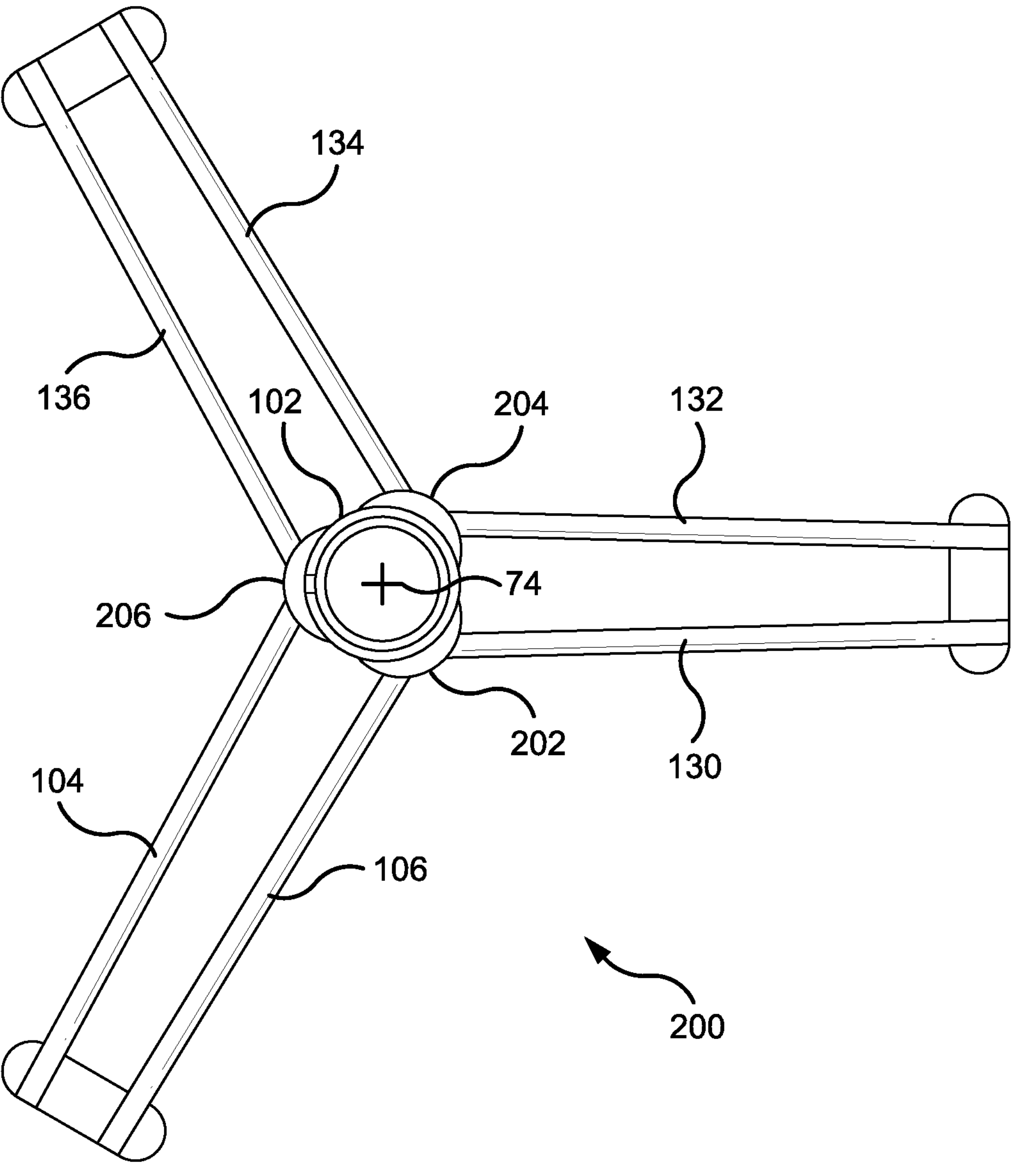
FIG. 12 is a bottom view of the lift pin actuator of FIG. 1 according to another example of the present disclosure, showing a lift pin actuator having flanged portions radially overlapping the merlons and supporting arms of the lift pin actuator.

With reference to FIG. 12, a lift pin actuator 200 is shown. The lift pin actuator 200 is similar to the lift pin actuator 100 (shown in FIG. 1) and additional includes castellated annulus 102 having a flange portion 202. The flange portion 202 extends radially outward from the first merlon 110 (shown in FIG. 3) at location below the second arm 106 and the third arm 130. In this respect it is contemplated that the first butt weld 152 (shown in FIG. 7) may overly the flange portion 202, the flange portion providing a shelf to facilitate fixturing the first arm 104 and the second arm 106 to the castellated annulus 102 during assembly. As will be appreciated by those of skill in the art in view of the present disclosure, fixturing the first arm 104 and the second arm 106 to the castellated annulus 102 during welding may simplify fabrication, for example, by retaining the first arm 104 and the second arm 106 in an orientation substantially orthogonal relative to the rotation axis 74 during a welding (or fusing) operation employed to form the butt weld 152.

In the illustrated example the flange portion 202 is a first flange portion 202 and the castellated annulus 102 (and thereby the lift pin actuator 200) has a second flange portion 204 and a third flange portion 206. The first flange portion 202 may extend radially outward from the first merlon 110 and circumferentially separate the second flange portion 204 from the third flange portion 206. The second flange portion 204 may extend radially outward from the second merlon 112 (shown in FIG. 5), underly the fourth arm 132 and the fifth arm 134, and circumferentially separate the first flange portion 202 from the third flange portion 206. The third flange portion 206 may extend radially outward from the third merlon 118 (shown in FIG. 6), underly the sixth arm 136 and the first arm 104, and circumferentially separate the second flange portion 204 from the first flange portion 202. Advantageously, forming three discrete flange portions, instead of a contiguous singular flange portion, limits shading of the underside of the substrate support 58 (shown in FIG. 2) that could otherwise be associated with a singular flange. As will be appreciated by those of skill in the art in view of the present disclosure, limiting shading can improve temperature variation on the substrate 2 (shown in FIG. 1) during deposition of the material layer 4 (shown in FIG. 1).

Figure 13:
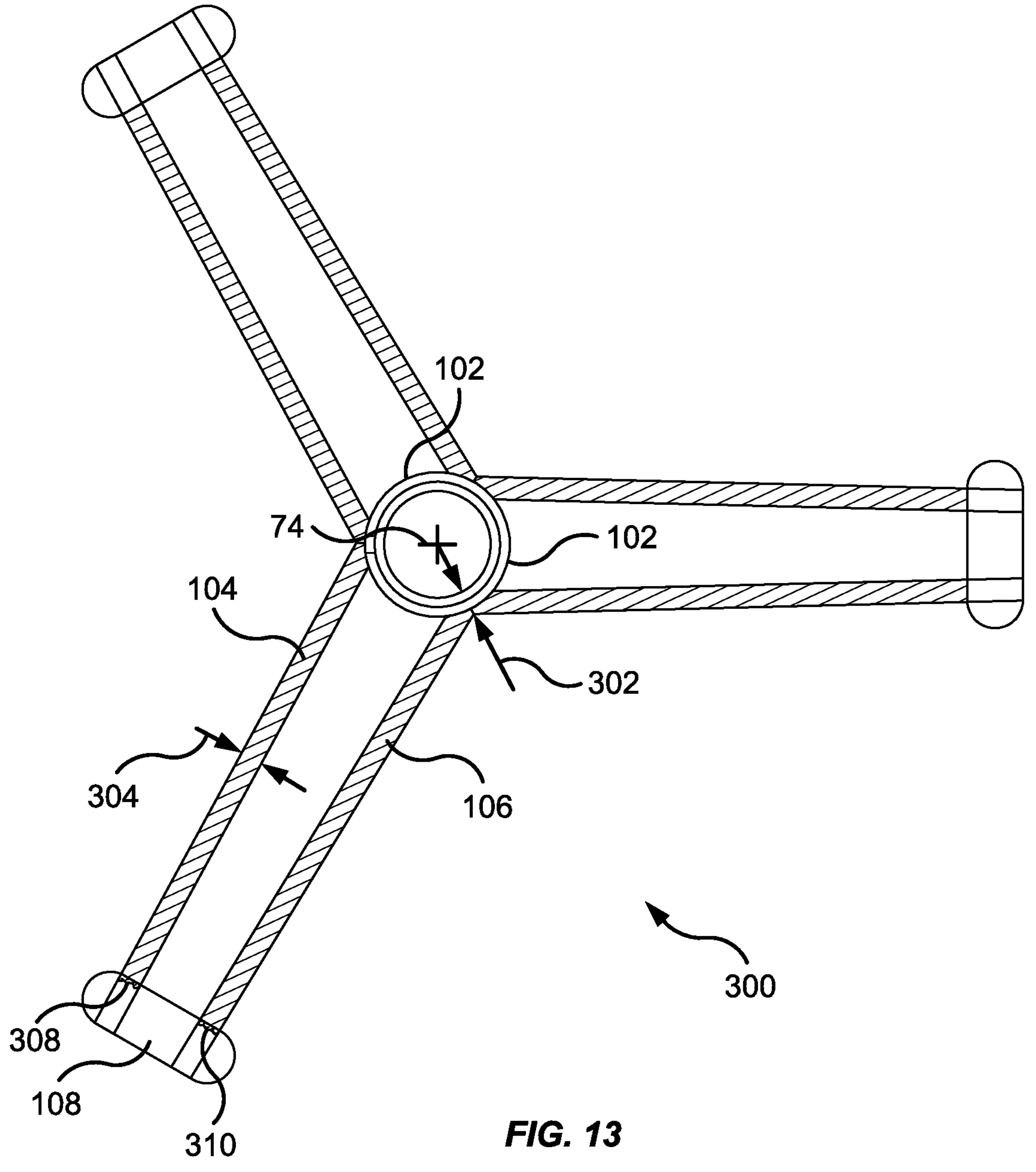
FIG. 13 is a bottom view of the lift pin actuator of FIG. 1 according to another example of the present disclosure, showing arms formed by thick cylindrical stock joined by butt welds to radially inner edges of pin pads of the lift pin actuator.

With reference to FIG. 13, a lift pin actuator 300 is shown. The lift pin actuator 300 is similar to the lift pin actuator 100 (shown in FIG. 1) and additionally includes arms having diameters greater than a wall thickness 302 of the castellated annulus 102. In this respect it is contemplated that at least the first arm 104 and the second arm 106 may have an arm diameter 304 that is greater than the wall thickness 302, and may be formed from thick cylindrical stock. The thick cylindrical stock may have a diameter greater than a wall thickness of the castellated annulus 102. Advantageously, forming the first arm 104 and the second arm 106 with the arm diameter 304 can simplify fabrication of the lift pin actuator 300, for example, by limiting tendency that the first arm 104 and/or the second arm 106 may have to bow during welding to the castellated annulus 102 and/or the first pin pad 108. In further respect, the first arm 104 and the second arm 106 may be connected to a radially inner edge 306 of the first pin pad 108 at a first arm edge weld 308 and a second arm edge weld 310 (which may be butt welds), the second arm edge weld 310 offset from the first arm edge weld 308 about the rotation axis 74. Employment of the first arm edge weld 308 and the second arm edge weld 310 may also reduce (or eliminate) tendency of the first arm 104 and/or the second arm 106 to distort during welding, further simplifying fabrication of the lift pin actuator 300. In certain examples, each of the arms may have a diameter greater than the wall thickness 302. In accordance with certain examples, each of the arms may be joined to radially inner edges of the pin pads at arm edge welds.

With reference to FIG. 14, a lift pin actuator 400 is shown. The lift pin actuator 400 is similar to the lift pin actuator 100 (shown in FIG. 1) and additionally includes a continuous arm body 402. The continuous arm body 402 may have an arcuate arm body segment 404 separating the second arm 106 from the third arm 130. The continuous arm body 402 may be connected to the second merlon 112 by an arm body weld 406.

In the illustrated example the continuous arm body 402 is a first continuous arm body 402 and the lift pin actuator 400 includes a second continuous arm body 408 and a third continuous arm body 410. The second continuous arm body 408 has a second arcuate body segment 412 separating the fourth arm 132 from the fifth arm 134, and connected to the third merlon 118 by a second arm body weld 414, and the third continuous arm body 410 has a third arcuate body segment 416 separating the sixth arm 136 from the first arm 104 and connected to the first merlon 110 by the third arm body weld 418. As will be appreciated by those of the skill in the art in view of the present disclosure, forming the lift pin actuator 400 with one or more continuous arm body may also simplify fabrication of the lift pin actuator 400, for example, by limiting the need to fixture arms to one another during a butt-welding process.

With reference to FIG. 15, a method 500 of making a lift pin actuator, e.g., the lift pin actuator 100 (shown in FIG. 1), shown. The method 500 includes forming a castellated annulus having a first merlon and a second merlon spaced apart from the first merlon by a crenel, e.g., the castellated annulus 102 (shown in FIG. 3), as shown with box 510. The method 500 also includes connecting a first arm to the first merlon, e.g., the first arm 104 (shown in FIG. 3) to the first merlon 110 (shown in FIG. 3), such that the first arm is tangent to the first merlon and extends outward from the castellated annulus, as shown with box 520. The method 500 further includes connecting a second arm to a second merlon of the castellated annulus, e.g., the second arm 106 (shown in FIG. 3) to the second merlon 112 (shown in FIG. 4), as shown with box 530.

It is contemplated that the second arm may be tangent to the second merlon, extend outward from the annulus, and be spaced apart from the first arm by a radial gap, e.g., the radial gap 116 (shown in FIG. 4), as also shown with box 530. A pin pad, e.g., the first pin pad 108 (shown in FIG. 3), is connected to the first arm and the second arm, the pin pad connected therethrough to the castellated annulus, such that the pin pad spaced apart from the castellated annulus by the radial gap and radially overlaps the crenel, as shown with box 540. It is contemplated that the lift pin actuator be configured to nest a support member within the lift pin actuator during translation of the lift pin actuator along the rotation axis relative to the support member, for example by sizing the radial gap to receive therein an arm of the support member, as shown with box 550. In certain examples the first arm may be welded to the castellated annulus, as shown with box 522. In accordance with certain examples, the second arm may be welded to the castellated annulus, as shown with box 532. It is also contemplated that, in accordance with certain examples, the pin pad may be welded to the first arm and the second arm at ends of the arms radially opposite the castellated annulus, as shown with box 542 and box 544.

With reference to FIG. 16, a material layer deposition method 600 is shown. The method 600 includes seating a substrate on a substrate support, e.g., the substrate 2 (shown in FIG. 1) on the substrate support 58 (shown in FIG. 2), as shown with box 610. Seating 610 the substrate on the substrate support may include translating a lift pin actuator along a rotation axis, e.g., the lift pin actuator 100 (shown in FIG. 1) along the rotation axis 74 (shown in FIG. 2), in a direction away from the substrate support and a support member, e.g., the support member 62 (shown in FIG. 2), as also shown with box 610. Seating 610 the substrate on the substrate support may include unnesting the lift pin actuator from about the support member, as shown with box 612. Seating 610 the substrate on the substrate support may include withdrawing a plurality of lift pins protruding from the substrate support, e.g., the plurality of lift pins 60 (shown in FIG. 2), as shown with box 614.

As shown with box 620, it is contemplated that the substrate may be heated while the substrate is seated on the substrate support. In this respect the substrate may be heated using an upper heater element array, e.g., the upper heater element array 30 (shown in FIG. 2). In further respect, the substrate may be heated using a lower heater element array, e.g., the lower heater element array 32 (shown in FIG. 2), using infrared electromagnetic radiation transmitted through the support member and the substrate support. It is also contemplated that the substrate may be heated directly using an upper heater element array, e.g., the upper heater element array (shown in FIG. 2). It is also contemplated that, in accordance with certain examples, the substrate may be heater using both an upper heater element array and a lower heater element ad remain within the scope of the present disclosure.

As shown with box 630, the substrate may be rotated while seated on the substrate support. In this respect a lift and rotate module, e.g., the lift and rotate module 38 (shown in FIG. 2) may rotate the substrate support and the substrate about a rotation axis, e.g., the rotation axis 74 (shown in FIG. 2). The lift and rotate module may rotate the substrate support using a shaft member, e.g., the shaft member 64 (shown in FIG. 2), and the support member. The shaft member may rotate relative to (e.g., within) a tube member, e.g., the tube member 66 (shown in FIG. 2), and the lift pin actuator. The support member may also rotate relative to the lift pin actuator.

As shown with box 640, the substrate may be exposed to a material layer precursor, e.g., the material layer precursor 20 (shown in FIG. 1), during rotation about the rotation axis. The material layer precursory may include a silicon-containing material, as shown with box 642. The material layer precursor may include one or more of a dopant, a halide, and/or a purge or carrier gas. It is also contemplated that the substrate may be maintained within an atmospheric or a reduced pressure environment during exposure to the material layer precursor.

As shown with box 650, it is contemplated that a material layer, e.g., the material layer 4 (shown in FIG. 1), deposit onto the substrate as a consequence to exposure to the material layer precursor. The material layer may be a silicon-containing material layer, as shown with box 652. The material layer may be an epitaxial material layer, as also shown with box 652. In certain examples, the epitaxial material layer may be a thin epitaxial material layer. In accordance with certain examples, the thin epitaxial material layer may be deposited onto a planarized and/or polished upper surface of the substrate. It is also contemplated that the substrate may include a pattern, such as a high emissivity pattern, and remain within the scope of the present disclosure.

As shown with box 660, flow of the material layer precursor may cease once the material layer reaches a predetermined thickness. Heating of the substrate may cease once the material layer reaches the predetermined thickness. Rotation of the substrate about the rotation axis may cease once the material layer reaches the predetermined thickness, and the support member may thereafter be registered in rotation about the rotation axis relative to the lift pin actuator, as also shown with box 660. For example, the lift and rotate module may rotate the support member such that an arm of the support member overlays a crenel and a radial gap defied by the lift pin actuator, e.g., registered such that the arm 90 (shown in FIG. 3) overlies the first crenel 114 (shown in FIG. 4) and the first radial gap 116 (shown in FIG. 3), the support member outside of translation envelop of the lift pin actuator.

As shown with box 670, the substrate may then be unseated from the substrate support. In this respect it is contemplated that the lift and rotate module may translate the lift pin actuator along the rotation axis toward the substrate support, for example, between the first position 76 (shown in FIG. 9) and the second position 78 (shown in FIG. 11). As the lift pin actuator translates along the rotation axis pin pads of the lift pin actuator, e.g., the first pin pad 108 (shown in FIG. 3), may come into abutment with ends of lift pins dangling from the substrate support, e.g., the plurality of lift pins 60 (shown in FIG. 2), the lift pin actuator thereafter driving the lift pins axially such that stem portions of the lift pins slide through the substrate support, as shown with box 674.

As the lift pin actuator approaches the second position the support member may nest within the lift pin actuator, as shown within box 672. In this respect a hub of the support member, e.g., the hub 86 (shown in FIG. 3), may be axially received within an annulus of the lift pin actuator, e.g., the annulus 102 (shown in FIG. 3), and the annulus radially overlap the hub so that both inhabit a common axial position along the rotation axis. In further respect, the arm of the support member may extend through the crenel of the lift pin actuator and the radial gap defined between an arm pair of the lift pin actuator, e.g., the first arm pair 124 (shown in FIG. 7), as also shown with box 672. As will be appreciated by those of skill in the art in view of the present disclosure, configuring the lift pin actuator to nest about the support member allows the support member to be positioned further from the support member than otherwise possible, limiting (or eliminating entirely) collateral heating of the substrate at locations overlying the support member due to heating of the support member by the substrate support during material layer deposition.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

The invention claimed is:

1. A lift pin actuator, comprising:

a castellated annulus having a first merlon and a second merlon, the castellated annulus arranged along a rotation axis, the second merlon spaced apart from the first merlon by a crenel;

a first arm connected to the first merlon and extending outward from the castellated annulus;

a second arm connected to the second merlon and extending outward from the castellated annulus, the second arm spaced from the first arm by a radial gap; and a pin pad connected to the castellated annulus by the first arm and the second arm, the pin pad spaced apart from the castellated annulus by the radial gap and radially overlapping the crenel to nest a support member within the lift pin actuator during translation of the lift pin actuator along the rotation axis relative to the support member.

2. The lift pin actuator of claim 1, wherein the castellated annulus is formed from quartz, wherein the first arm is formed from quartz, wherein the second arm is formed from quartz, and wherein the pin pad is formed from quartz, and wherein the lift pin actuator is formed as a weldment.

3. The lift pin actuator of claim 1, wherein the castellated annulus comprises three merlons circumferentially spaced apart from one another by three crenels.

4. The lift pin actuator of claim 1, wherein the crenel is a first crenel and the castellated annulus defines a second crenel and a third crenel, wherein the castellated annulus has a third merlon that is circumferentially spaced from the second merlon by the second crenel and circumferentially spaced from the first merlon by the third crenel.

5. The lift pin actuator of claim 1, wherein the first arm is tangent to the castellated annulus and arranged along a first arm axis, wherein the second arm is tangent to the castellated annulus and arranged along a second arm axis, wherein the first arm axis is skew to the rotation axis, and wherein the second arm axis is skew to the rotation axis.

6. The lift pin actuator of claim 1, wherein the first arm and the second arm form a first arm pair, wherein the first arm and the second arm are formed from cylindrical stock, and wherein the lift pin actuator further comprises:

a second arm pair extending outward from the castellated annulus and circumferentially offset from the first arm pair about the rotation axis; and a third arm pair extending radially outward from the castellated annulus and circumferentially intermediate the second arm pair and the third arm pair.

7. The lift pin actuator of claim 1, further comprising:

a third arm that is circumferentially offset from the first arm and extending outward from the castellated annulus, the second arm and the third arm extending outward from the second merlon; and a fourth arm that is circumferentially offset from the third arm and extending outward from the castellated annulus, wherein the fourth arm is circumferentially spaced from the first arm by both the crenel and the second merlon.

8. The lift pin actuator of claim 7, wherein the third arm is joined to the second arm by a butt weld overlying the second merlon, and wherein the third arm and the second arm define an obtuse angle radially outward of the castellated annulus.

9. The lift pin actuator of claim 7, wherein the third arm and the second arm are defined by a continuous arm body, the third arm separated from the second arm by an arcuate arm body segment, the arcuate arm body segment joined to the second merlon by an arm body weld.

10. The lift pin actuator of claim 7, wherein the second merlon has a flange portion extending radially outward from the castellated annulus, and wherein the third arm and the second arm are connected to the castellated annulus by an axial weld overlying the flange portion.

11. The lift pin actuator of claim 7, wherein the castellated annulus has a third merlon and the lift pin actuator further comprises:

a fifth arm that is circumferentially offset from the fourth arm and extending outward from the castellated annulus, the fifth arm connected to the third merlon; and a sixth arm that is circumferentially intermediate the fifth arm and the first arm, the sixth arm connected to the third merlon.

12. The lift pin actuator of claim 1, wherein the pin pad is axially offset from the castellated annulus by the first arm and the second arm of the lift pin actuator.

13. The lift pin actuator of claim 1, wherein the pin pad is fixed to the first arm by a first arm weld, wherein the pin pad is fixed to the second arm by a second arm weld.

14. The lift pin actuator of claim 13, wherein the first arm weld connects a pin pad underside to the first arm and the second arm weld connects the pin pad underside to the second arm.

15. The lift pin actuator of claim 1, wherein the first arm and the second arm are connected to a radially inner edge of the pin pad at a first arm edge weld and a second arm edge weld, wherein the second arm edge weld is offset from the first arm edge weld about the rotation axis.

16. The lift pin actuator of claim 1, wherein the pin pad is a first pin pad and the lift pin actuator further comprises:

a second pin pad that is circumferentially offset from the first pin pad about the rotation axis; and a third pin pad that is circumferentially intermediate the second pin pad and the first pin pad.

17. The lift pin actuator of claim 16, wherein the first arm and the second arm form a first arm pair, the lift pin actuator further comprising:

a second arm pair that is circumferentially offset from the first arm pair and connecting the second pin pad to the castellated annulus, the second arm pair defining a second radial gap therebetween;

a third arm pair that is circumferentially intermediate the second arm pair and the first arm pair, the third arm pair connecting the third pin pad to the castellated annulus, the third arm pair defining a third radial gap therebetween; and wherein the second pin pad is radially separated from a second crenel by the second radial gap, and wherein the third pin pad is radially separated from a third crenel by the third radial gap.

18. The lift pin actuator of claim 1, wherein the castellated annulus has a wall thickness, wherein the first arm and the second arm have an arm diameter, and wherein the arm diameter of the first arm and the second arm is greater than the wall thickness of the castellated annulus.

19. A semiconductor processing system, comprising:

a chamber body having a hollow interior;

a divider with a divider aperture seated within the chamber body and dividing the interior of the chamber body into an upper chamber and a lower chamber, the divider aperture fluidly coupling the upper chamber to the lower chamber;

a substrate support arranged within the divider aperture and configured to seat thereon a substrate during deposition of a material layer onto the substrate;

a plurality of lift pins slidably received within the substrate support and configured to seat the substrate on the substrate support prior to deposition of the material layer and unseat after deposition of the material layer;

a support member arranged within the lower chamber of the chamber body and fixed relative to the substrate support;

a shaft member fixed relative to the support member and extending through a lower wall of the chamber body;

a lift pin actuator as recited in claim 1 arranged within the lower chamber of the chamber body and translatable along the rotation axis relative to the substrate support between a first position and a second position, the lift pins dangling below the substrate support when the lift pin actuator is in the first position, the lift pins protruding above the substrate support when the lift pin actuator is in the second position; and wherein the support member nests within the lift pin actuator when the lift pin actuator is in the second position to space the support member from the substrate support and limit heating of the substrate by the support member during deposition of the material layer onto the substrate.

20. The semiconductor processing system of claim 19, further comprising:

a tube member extending about the shaft member and extending through the lower wall of the chamber body and into the lower chamber of the chamber body, the castellated annulus connected to an end of the tube member disposed within the lower chamber of the chamber body; and a lift and rotate module operably connected to the substrate support by the shaft member and the support member to rotate the substrate support about the rotation axis, the lift and rotate module operably connected to the tube member to translate the lift pin actuator along the rotation axis between the first position and the second position.

21. The semiconductor processing system of claim 19, further comprising a controller including a processor disposed in communication with a memory having instructions recorded thereon that, when read by the processor, cause the processor to:

register the support member relative to the lift pin actuator about the rotation axis;

translate the lift pin actuator along the rotation axis between the first position and the second position; and nest the support member within the lift pin actuator during translation of the lift pin actuator between the first position and the second position, the support member and the lift pin actuator occupying a common axial position in the second position.

22. A process kit for a semiconductor processing system, comprising:

a lift pin actuator as recited in claim 1, wherein the first arm and the second arm form a first arm pair, and wherein the lift pin actuator includes a second arm pair and a third arm pair, the second arm pair that is circumferentially offset from the first arm pair, the third arm pair that is circumferentially intermediate the second arm pair and the first arm pair; and a support member including a hub and an arm extending radially outward from the hub, the hub having a hub width smaller than the castellated annulus to nest axially within the castellated annulus, the arm having an arm width less than a circumferential width of the crenel to nest within radial gaps bounded between arms of each of the arm pairs.

23. A method making a lift pin actuator, comprising:

forming a castellated annulus having a first merlon and a second merlon spaced apart from the first merlon by a crenel;

arranging the castellated annulus along a rotation axis connecting a first arm to the first merlon such that the first arm is tangent to the first merlon and extends outward from the castellated annulus;

connecting a second arm to the second merlon such that the second arm is tangent to the second merlon, extends outward from the castellated annulus, and is spaced apart from the first arm by a radial gap;

connecting a pin pad to the first arm and the second arm, the pin pad connected therethrough to the castellated annulus such that the pin pad is spaced apart from the castellated annulus by the radial gap and radially overlaps the crenel; and whereby the lift pin actuator is configured to nest a support member within the lift pin actuator during translation of the lift pin actuator along the rotation axis relative to the support member.

24. A material layer deposition method, comprising:

at a lift pin actuator including a castellated annulus arranged along a rotation axis and having a first merlon and a second merlon spaced apart from the first merlon by a crenel; a first arm connected to the first merlon and extending outward from the castellated annulus; a second arm connected to the second merlon and extending outward from the castellated annulus, the second arm spaced from the first arm by a radial gap; and a pin pad connected to the castellated annulus by the first arm and the second arm, the pin pad spaced apart from the castellated annulus by the radial gap and radially overlapping the crenel, seating a substrate on a substrate support by translating the lift pin actuator along the rotation axis away from a substrate support fixed relative to a support member, a lift pin protruding from the substrate support withdrawing into the substrate support;

heating the substrate;

rotating the substrate support and the support member about the rotation axis;

exposing the substrate to a material layer precursor, wherein the material layer precursor includes a silicon-containing material;

depositing a material layer onto the substrate using the material layer precursor, wherein the material layer is an epitaxial silicon layer;

registering the support member to the lift pin actuator; and unseating the substrate from the substrate support by nesting the lift pin actuator about the support member, the lift pin actuator radially overlapping the support member, the lift pin actuator unseating the substrate by driving the lift pin through the substrate support.

* * * * *